United States Patent
Chen et al.

(10) Patent No.: US 8,331,127 B2
(45) Date of Patent: Dec. 11, 2012

(54) NONVOLATILE MEMORY DEVICE HAVING A TRANSISTOR CONNECTED IN PARALLEL WITH A RESISTANCE SWITCHING DEVICE

(75) Inventors: Yi-Chou Chen, Hsinchu (TW);
Wei-Chih Chien, Hsinchu (TW);
Feng-Ming Lee, Changhua County (TW)

(73) Assignee: Macronix International Co., Ltd. (TW)

( * ) Notice: Subject to any disclaimer, the term of this patent is extended or adjusted under 35 U.S.C. 154(b) by 269 days.

(21) Appl. No.: 12/785,978

(22) Filed: May 24, 2010

(65) Prior Publication Data

US 2011/0286258 A1 Nov. 24, 2011

(51) Int. Cl.
*G11C 13/00* (2006.01)
(52) U.S. Cl. ........... 365/113; 365/163; 365/46; 365/148
(58) Field of Classification Search .................. 365/113, 365/163, 46, 148
See application file for complete search history.

(56) References Cited

U.S. PATENT DOCUMENTS

| | | | |
|---|---|---|---|
| 5,313,418 A | 5/1994 | Wada et al. | |
| 6,977,842 B2 | 12/2005 | Nazarian | |
| 7,298,640 B2 | 11/2007 | Chen et al. | |
| 7,298,657 B2 | 11/2007 | Domae et al. | |
| 7,492,635 B2 * | 2/2009 | Kim et al. | 365/185.17 |
| 2005/0248978 A1 | 11/2005 | Chen et al. | |
| 2007/0121369 A1 | 5/2007 | Happ | |
| 2008/0073681 A1 | 3/2008 | Kanaya | |
| 2009/0230449 A1 | 9/2009 | Sakaguchi | |

OTHER PUBLICATIONS

"Toshiba Develops New NAND Flash Technology", Jun. 12, 2007.
Tanaka, et al. "Bit Cost Scalable Technology with Punch and Plug Process for Ultra High Density Flash Memory", 2007 Symposium on VLSI Technology Digest of Technical Papers.
Shimojo, et al. "High-Density and High-Speed 128Mb Chain FeRAM with SDRAM-Compatible DDR2 Interface" 2009 Symposium on VLSI Technology Digest of Technical Papers.
Chen, et al., "Phase Change Memory Joint Project" Ultra-thin Phase-Change Bridge Memory Device Using GeSb ISSCC 2007 San Francisco, CA.

* cited by examiner

Primary Examiner — Jason Lappas
(74) Attorney, Agent, or Firm — Baker & McKenzie LLP

(57) ABSTRACT

A memory device comprises an array of memory cells each capable of storing multiple bits of data. The memory cells are arranged in memory strings that are connected to a common source line. Each memory cell includes a programmable transistor connected in parallel with a resistance switching device. The transistor is switchable between a plurality of different threshold voltages associated with respective memory states. The resistance switching device is configured to be switchable between a plurality of different resistances associated with respective memory states.

30 Claims, 19 Drawing Sheets

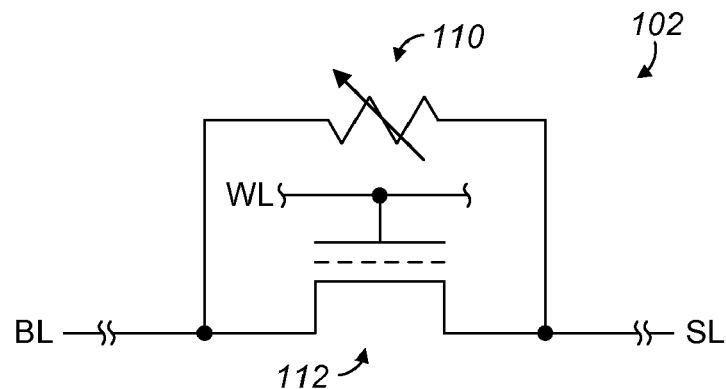
FIGURE 3
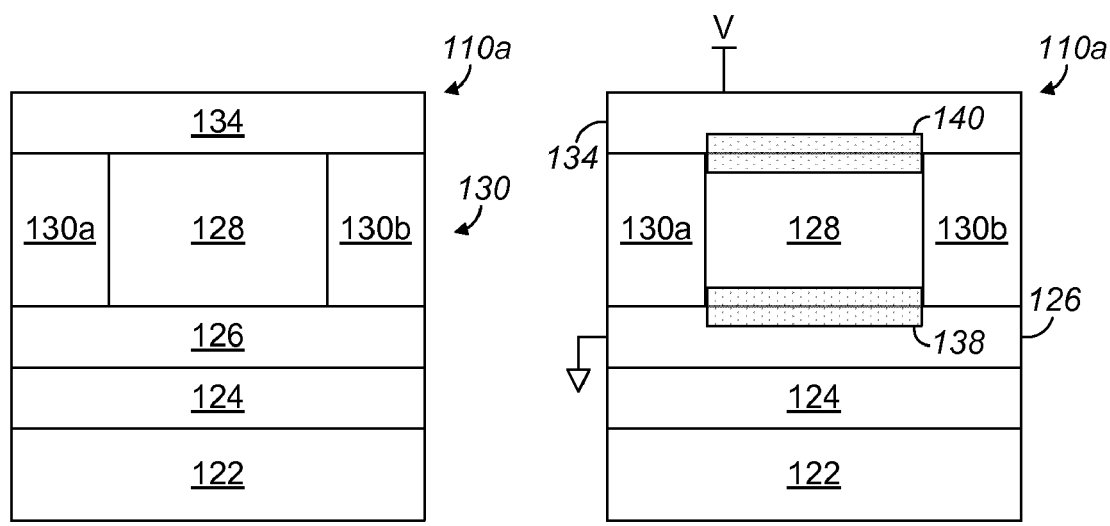
FIGURE 4A  FIGURE 4B

NONVOLATILE MEMORY DEVICE HAVING A TRANSISTOR CONNECTED IN PARALLEL WITH A RESISTANCE SWITCHING DEVICE

BACKGROUND

1. Technical Field

The present invention relates to electronic memory devices, and more particularly, to semiconductor memory devices suitable for use as a nonvolatile memory devices.

2. Related Art

Electronic memory devices are well known and commonly found in a variety of electronic systems. For example, electronic memory devices (sometimes referred to as computer memory) can be found in computers and other computing devices. Various removable or stand-alone electronic memory devices are also known, such as memory cards or solid-state data storage systems. For example, it is known to use a removable memory card for storing pictures on a digital camera or for storing movies recorded with a digital video recorder.

Most electronic memory devices can be classified as either volatile or nonvolatile. A volatile electronic memory device is, in general, one which requires power in order to maintain the stored information. An example of a volatile electronic memory device is a Static Random Access Memory (SRAM) or Dynamic Random Access Memory (DRAM) computer memory device, which only retains the stored data while the computer is on, and which loses the stored data when the computer is turned off or otherwise loses power. In contrast, a nonvolatile electronic memory device is, in general, one which is capable of retaining stored data in the absence of an external power source. An example of a nonvolatile memory is a memory card such as those commonly used with digital cameras. Such a memory card can record a picture taken with the camera, and can retain the picture data even while the memory card is removed from the camera.

As the systems that use electronic memory devices become more powerful, the demand for data storage capacity increases as well. For example, more powerful computers and software generally operate better with increased amounts of random access memory (RAM); higher resolution cameras create larger picture and movie files that are better accommodated by memory cards having larger storage capacity. Thus, a trend in the electronic memory device industry has been to find ways of increasing the data storage capacity of memory devices. However, it is not sufficient to simply increase capacity—it is often equally desirable to maintain, or even reduce, the size of a memory device while increasing the data storage capacity. Thus, another trend has been towards increasing the amount of data storage for a given size, in other words towards greater bit density. Still another consideration is cost. For example, it is desirable to maintain or reduce the cost of an electronic memory device as the bit density increases. In other words, it is desirable to reduce the bit cost (cost per bit) of electronic memory devices. Still further considerations are performance related, such as providing faster storage of data and faster access to data stored on an electronic memory device.

One approach to providing increased bit density has been to reduce the size of individual memory cells. For example, as manufacturing processes are improved, smaller structures can be formed, thereby allowing for the manufacture of smaller memory cells. However, some projections indicate that bit cost will begin to increase using this approach in the future, because at some point the process cost will likely begin to increase more rapidly than the memory-cell-reduction rate. Thus, it is desirable to find alternative approaches for increasing the bit density of electronic memory devices.

SUMMARY

Memory devices and methods associated with memory devices are described herein. According to one aspect of the present disclosure, a memory device can comprise an array of memory cells, where each memory cell respectively comprises a transistor and a resistance switching device connected in parallel with the transistor. The transistor and the resistance switching device can each be capable of independently storing one or more bits of data. The transistor can comprise a first terminal, a second terminal, and a gate terminal, and be configured to be switchable between a plurality of different threshold voltages associated with respective memory states. The resistance switching device can be connected in parallel with the transistor such that the resistance switching device is connected to the first and second terminals of the transistor. The resistance switching device can be configured to be switchable between a plurality of different resistances associated with respective memory states.

According to another aspect of the present disclosure, a memory device can comprise a plurality of bit lines, a plurality of word lines, a first memory string comprising a first group of memory cells, and a second memory string comprising a second group of memory cells. The first and second memory strings can be connected to a common source line and to respective bit lines. The word lines can be connected to respective memory cells of the first group of memory cells and to respective memory cells of the second group of memory cells. Each of the memory cells can respectively comprise a transistor and a resistance switching device connected in parallel with the transistor. The transistor and the resistance switching device can each be capable of independently storing one or more bits of data. The transistor can comprise a first terminal, a second terminal, and a gate terminal. The transistor can be configured to be switchable between a plurality of different threshold voltages associated with respective memory states. The resistance switching device connected in parallel with the first transistor can be connected to the first and second terminals of the first transistor. The resistance switching device can be configured to be switchable between a plurality of different resistances associated with respective memory states.

According to still further aspects of the present disclosure, methods of reading and writing to a memory cell is provided for reading and writing to a memory cell that comprises a transistor and a resistance switching device connected in parallel with the transistor, where the transistor and the resistance switching device are each capable of independently storing one or more bits of data. For example, according to one aspect of the present disclosure, a reading method can comprise detecting a threshold voltage of the transistor of the memory cell, where the transistor is configured to be switchable between a plurality of threshold voltages associated with respective memory states. The reading method can also comprise detecting a resistance of the resistance switching device of the memory cell, where the resistance switching device is configured to be switchable between a plurality of resistances associated with respective memory states. These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which:

FIG. 3 shows a schematic diagram of a memory cell of the memory device shown in FIG. 1;

FIGS. 4A and 4B show schematic views of a resistance switching device according to some embodiments of the resistance switching device shown in FIG. 3.

DETAILED DESCRIPTION

Figure 1:
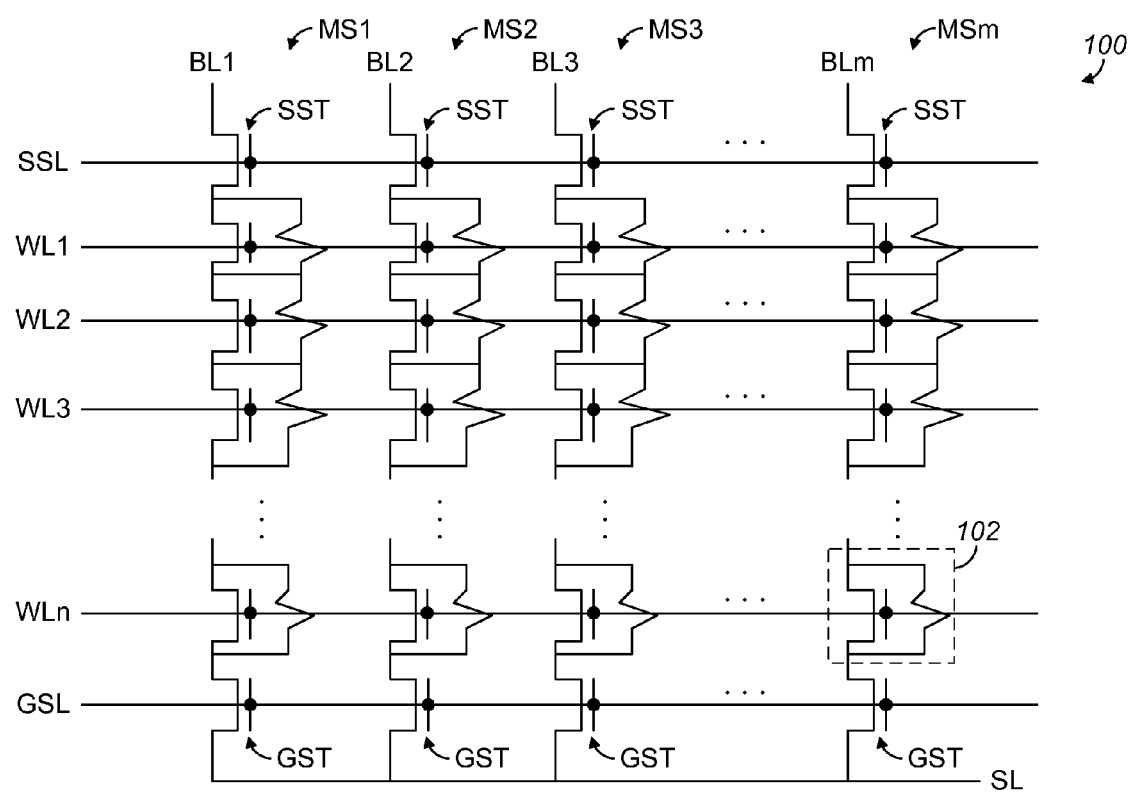
FIG. 1 shows a block diagram of a memory device in accordance with an embodiment of the present disclosure.

FIG. 1 shows a block diagram of a memory array 100 in accordance with an embodiment of the present disclosure. The memory array 100 can include a plurality of memory cells 102, a plurality of bit lines BL1-BLm, a plurality of word lines WL1-WLn, a string select line SSL, a ground select line GSL, and a common source line SL.

The memory array 100 can be configured such that the memory cells 102 are arranged in an array of m×n memory cells 102, where m and n represent respective natural numbers. More specifically, the memory array 100 can be configured such that the memory cells 102 are arranged into a plurality of memory strings MS1-MSm. Each of the memory strings MS includes a respective string select transistor SST, a respective group of n memory cells 102, and a respective ground select transistor GST connected in series. The memory strings MS1-MSm are connected to respective bit lines BL1-BLm. The memory strings MS1-MSm are all connected to the common source line SL.

Figure 2:
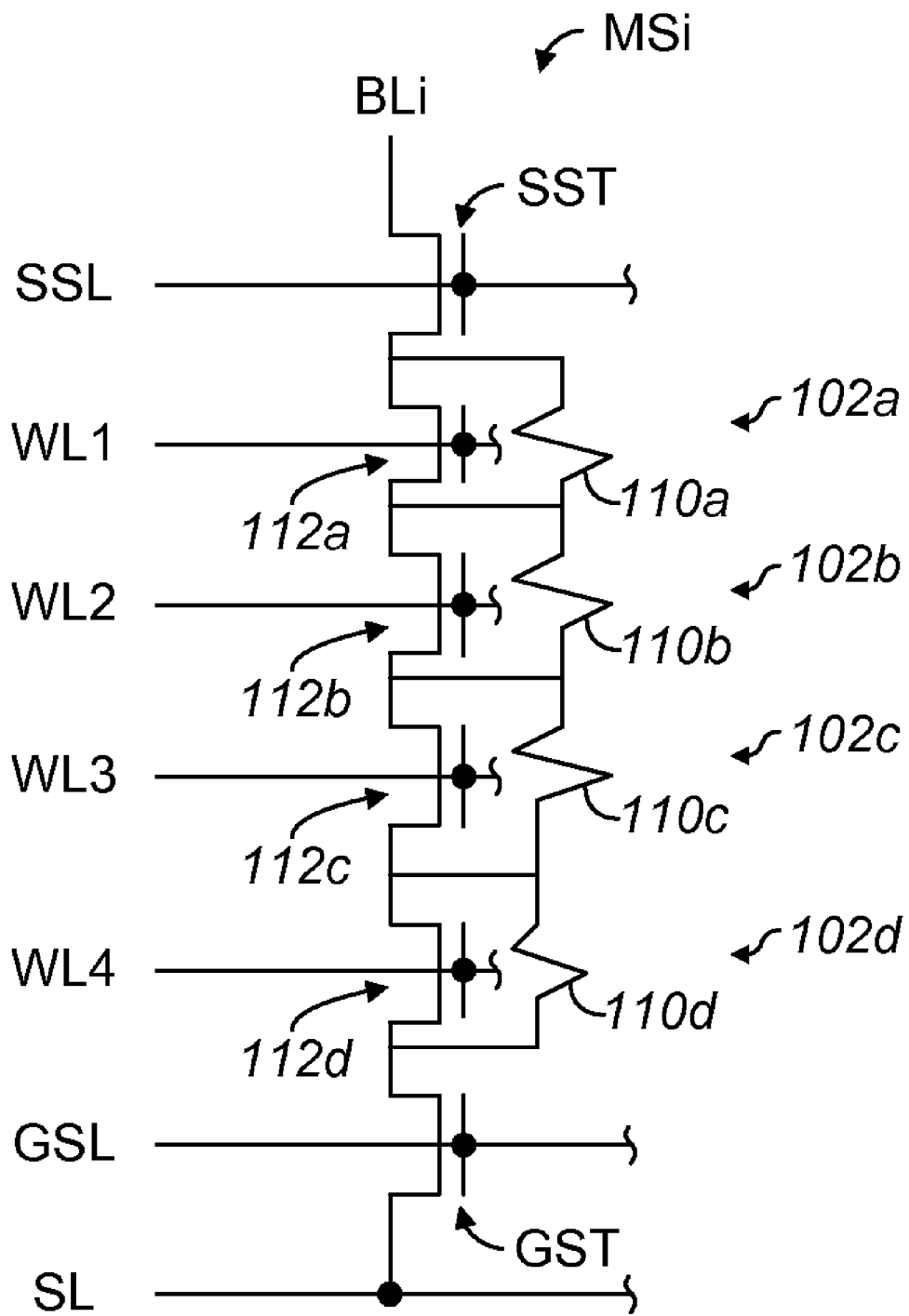
FIG. 2 shows a schematic diagram of a memory string of the memory device shown in FIG. 1.

FIG. 2 shows a schematic diagram of a memory string MSi, which serves as an example of a memory string that can be used as any of the memory strings MS1-MSm shown in FIG. 1. The memory string MSi includes a string select transistor SST, first through fourth memory cells 102a-102d, and a ground select transistor GST. The string select transistor SST, first through fourth memory cells 102a-102d, and ground select transistor GST are connected in series between bit line BLi and common source line SL. While the memory string MSi includes four memory cells 102a-102d, actual implementations can include additional memory cells, for example 16, 32, 64 or more memory cells as desired. First through fourth memory cells 102a-102d include respective resistance switching devices 110a-110d and respective transistors 112a-112d. Also, it is preferable for neighboring transistors to share a common source and/or drain in order to minimize the cell size. If neither the source nor the drain are common structures in neighboring transistors, it is difficult to achieve a desired design rule that is not larger than $4F^2$.

The gate of the string select transistor SST is connected to the string select line SSL. The source of the string select transistor SST is connected to the bit line BLi. The drain of the string select transistor SST is connected to the first memory cell 102a.

The gate of the ground select transistor GST is connected to the ground select line GSL. The source of the ground select transistor GST is connected to the last memory cell 102d. The drain of the ground select transistor GST is connected to the common source line SL.

FIG. 3 shows a schematic diagram of a memory cell 102 according to an embodiment of the present disclosure. The memory cells 102a-102d can be configured as shown in FIG. 3. The memory cell 102 includes plural memory elements connected in parallel. In this embodiment, the memory cell 102 includes, as a first memory element, a resistance switching device 110 and, as a second memory element, a transistor 112, which can be a floating gate transistor, n-type transistor, p-type transistor or Fin-FET.

The transistor 112 can be configured such that the gate is connected to a word line WL. The source of the transistor 112 is connected to the bit line BL through a string select transistor SST and any intervening memory cells 102 as shown in FIG. 2. The drain of the transistor 112 is connected to the common source line SL through a ground select transistor GST and any intervening memory cells 102 as shown in FIG. 2.

The source and drain of the transistor 112 are also connected to opposite ends of the resistance switching device 110 such that the resistance switching device 110 and the transistor 112 are connected in parallel. In some embodiments, the resistance switching device 110 can be formed above the transistor 112 and word line WL as shown in FIG. 3. In such embodiments, the memory cell 102 can be formed by first forming the transistor 112 and word line WL, and then forming the resistance switching device 110 above the transistor 112 and word line WL.

The transistor 112 can be a floating gate transistor, n-type transistor, p-type transistor or Fin-FET that is configured such that the threshold voltage Vt of the transistor 112 is changeable between two or more values, where certain values of Vt are associated with respective memory states. For example, the transistor 112 can be a single-level cell (SLC) floating gate transistor, a multi-level cell (MLC) floating gate transistor, a nano-crystal flash transistor, or a nitride trap device.

Thus, the transistor 112 can be configured to store plural Vt states in one or plural locations. In some embodiments, for example, the transistor 112 can be configured to be a 1-bit memory device capable of being programmed to either one of two distinct threshold voltages Vt. Such embodiments can include embodiments where the transistor 112 is an SLC floating gate transistor. In some embodiments, for example, the transistor 112 can be configured to be a 2-bit memory device capable of being programmed to any one of four distinct threshold voltages Vt. Such embodiments can include embodiments where the transistor 112 is an MLC floating gate transistor. Embodiments of the transistor 112 that include a floating gate device can be programmed by hot electron injection and erased by Fowler-Nordheim (FN) electron tunneling.

The resistance switching device 110 can be configured such that the resistance of the resistance switching device 110 is changeable between multiple resistance values, where certain resistance values are associated with respective memory states. For example, the resistance switching device 110 can be a resistance type memory device as described in U.S. Pat. No. 7,524,722 to Lee et al., which is hereby incorporated by reference.

Thus, in some embodiments, the memory cell 102 can be configured to store one or more bits. For example, in some embodiments, the transistor 112 can be configured to be switched between two memory states and the resistance switching device 110 can be configured to be switched between two memory states so that the memory cell 102 is a two-bit memory device capable of a total of four memory states. As another example, in some embodiments, the transistor 112 can be configured to be switched between four memory states and the resistance switching device 110 can be configured to be switched between four memory states so that the memory cell 102 is a 4-bit memory device capable of a total of sixteen memory states. Still further embodiments can include a transistor 112 configured to be switched between a selected number N1 threshold voltages associated with respective memory states, and the resistance switching device 110 is configured to be switched between a selected number N2 resistances associated with respective memory states, so that the memory cell 102 is therefore configured to have a total of N1+N2 memory states.

FIG. 4A shows a schematic view of a resistance switching device 110a according to some embodiments of the resistance switching device 110. The resistance switching device 110a includes a substrate 122, an intermetal dielectric (IMD) layer 124, a first electrode layer 126, a tungsten oxide layer 128, first and second dielectric structures 130a and 130b, and a second electrode layer 134.

The substrate 122 can be a silicon substrate, and the intermetal dielectric layer 124 can be an oxide layer or other electrically-insulating layer formed on the substrate 122 by known methods, for example by chemical vapor deposition (CVD).

The first electrode 126 can be formed of titanium nitride (TiN) and disposed on the IMD layer 124 by a CVD or physical vapor deposition (PVD) process. Alternatively, the material of the first electrode 126 can include doped polysilicon, aluminum, copper, or tantalum nitride (TaN).

The tungsten oxide layer 128 is formed over the first electrode 126. The first and second dielectric structures 130a and 130b flank the tungsten oxide layer 128 and are also formed over the first electrode 126. The dielectric structures 130a and 130b can contain, for example, $SiO_2$, $Si_3N_4$, or similar insulating materials. The structure comprising the tungsten oxide layer 128 and the first and second dielectric structures 130a and 130b can be formed by first forming a dielectric layer 130 as a continuous dielectric layer over the first electrode, for example by a CVD process. Next, a portion of the continuous dielectric layer is removed, for example by photolithography and etching, thereby resulting in a gap between the first and second dielectric structures 130a and 130b. Next, the tungsten oxide layer 128 is formed in the gap between the first and second dielectric structures 130a and 130b. More specifically, the tungsten oxide layer 128 can be formed by first depositing tungsten in the gap between the first and second dielectric structures 130a and 130b, then performing an oxidation process so that the tungsten is oxidized. For example, a thermal oxidation process can be used such that oxidation is diffused through most or all of the tungsten layer, thereby resulting in the formation of the tungsten oxide layer 128.

The second electrode 134 can be formed of titanium nitride (TiN) and disposed over the tungsten oxide layer 128 by a CVD or PVD process. The second electrode 134 can extend over the dielectric structures 130a and 130b as well. The material of the second electrode 134 can alternatively include doped polysilicon, aluminum, copper, or tantalum nitride (TaN).

Full oxidation of the tungsten oxide layer 128 results in the formation of first and second interface regions 138 and 140 of adjustable resistance. FIG. 4B shows the respective locations of the first and second interface regions 138 and 140. The first interface region 138 includes the region at the interface of the first electrode 126 and the tungsten oxide layer 128. The second interface region 140 includes the region at the interface of the second electrode 134 and the tungsten oxide layer 128.

FIGS. 5A-5E show the resistance switching characteristics of a symmetrical two-state embodiment of the resistance switching device 110a. That is, in the present embodiment, the resistance switching device 110a includes two interface regions 138 and 140, each having two resistance values (memory states), and each being at least substantially symmetrical to the other. Alternative embodiments, including those described herein, can include embodiments that are not symmetric and/or include more than two resistance values per interface region.

The resistance between the first and second electrodes 126 and 134 through the tungsten oxide layer 128 can be adjusted between two resistance values R1 and R2. The resistance switching behavior of the resistance switching device 110a will occur at either the first interface region 138 or the second interface region 140. As will be described in more detail with reference to FIGS. 5A-5E, a voltage pulse can be used to select between the first and second interface regions 138 and 140 as the interface region for controlling the switching behavior of the resistance switching device 110a. This is significant because the voltage level required to switch the resistance value from R1 to R2 or vice-versa will depend on whether the first interface region 138 or the second interface region 140 is currently controlling the switching behavior of the resistance switching device 110a.

Figure 5A:
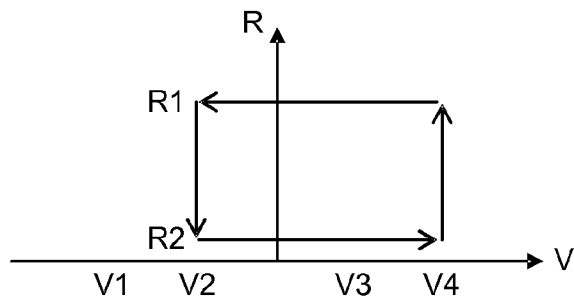
FIGS. 5A-5E show resistance switching characteristics of a symmetrical two-state embodiment of the resistance switching device shown in FIGS. 4A and 4B.

Turning first to FIG. 5A, this graph shows the resistance switching characteristics of the present embodiment of the resistance switching device 110a while the second interface region 140 is controlling the resistance switching characteristics. Here, the resistance switching device 110a can be controlled to either have a reset resistance R1 or a set resistance R2. If the resistance of the resistance switching device 110a is R1, the resistance can be decreased from R1 to R2 by applying a negative voltage V2 across the resistance switching device 110a as shown in FIG. 4B between the voltage supply terminal and ground. Similarly, if the resistance of the resistance switching device 110a is R2, the resistance can be increased from R2 to R1 by applying a positive voltage V4 across the resistance switching device 110a.

Figure 5B:
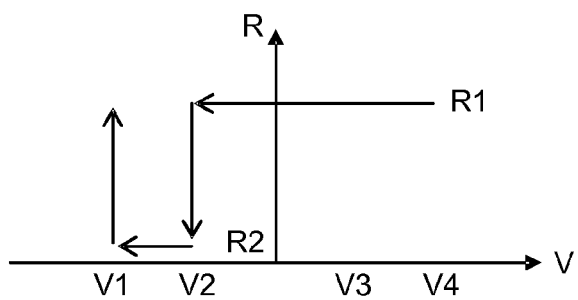

FIG. 5B shows the process for switching control from the second interface region 140 to the first interface region 138. Specifically, the control of the resistance switching characteristics of the present embodiment of the resistance switching device 110a can be switched from the second interface region 140 to the first interface region 138 by applying a negative voltage V1 across the resistance switching device 110a.

Figure 5C:
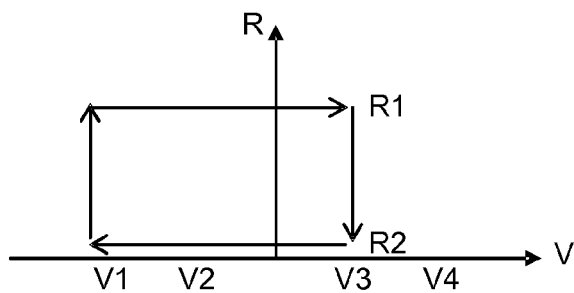

The result of the switch at FIG. 5B is shown in FIG. 5C, where the first interface region 138 is now controlling the resistance switching characteristics of the present embodiment of the resistance switching device 110a. The behavior illustrated in FIG. 5C can be compared with that of FIG. 5A in order to observe the difference between the resistance switching characteristics of the present embodiment of the resistance switching device 110a when the first interface region 138 is controlling and the resistance switching characteristics of the present embodiment of the resistance switching device 110a when the second interface region 1440 is controlling. Now, at FIG. 5C, with the first interface region 138 controlling, the resistance can be decreased from R1 to R2 by applying a positive voltage V3 across the resistance switching device 110a, and resistance can be increased from R2 to R1 by applying a negative voltage V1 across the resistance switching device 110a.

Figure 5D:
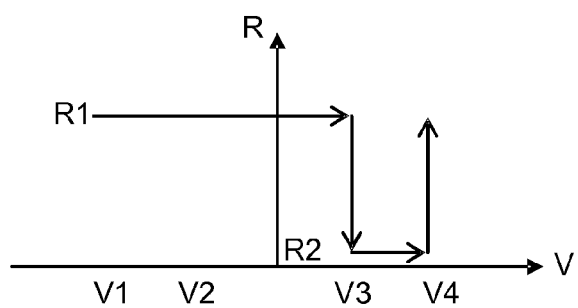

FIG. 5D shows the process for switching control from the first interface region 138 to the second interface region 140. Specifically, the control of the resistance switching characteristics of the present embodiment of the resistance switching device 110a can be switched from the first interface region 138 to the second interface region 140 by applying a positive voltage V4 across the resistance switching device 110a.

Figure 5E:
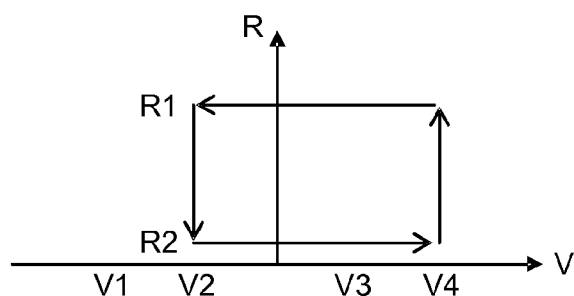

The result of the switch at FIG. 5D is shown in FIG. 5E, identical to FIG. 5A, where once again the second interface region 140 is controlling the resistance switching characteristics of the present embodiment of the resistance switching device 110a.

Thus, the resistance switching device 110a can be set to any of four states, which can serve as four memory states: (1) first interface controlling and resistance=R1 (state "$R_{RESET}$"); (2) first interface controlling and resistance=R2 (state "$R_{SET}$"); (3) second interface controlling and resistance=R1 (state "$\underline{R_{RESET}}$"); and (4) second interface controlling and resistance=R2 (state "$\underline{R_{SET}}$"). It is difficult to distinguish between the states $R_{SET}$ and $\underline{R_{SET}}$. However, the states $R_{RESET}$ and $\underline{R_{RESET}}$ can be reliably distinguished from each other. Also, each of the states $R_{RESET}$ and $\underline{R_{RESET}}$ can be reliably distinguished from the states $R_{SET}$ and $\underline{R_{SET}}$. Thus, the resistance switching device 110a according to the present embodiment can be configured to serve as a three-state memory device having states (1) $R_{RESET}$; (2) $\underline{R_{RESET}}$; and (3) $R_{SET}$ or $\underline{R_{SET}}$.

Figure 6:
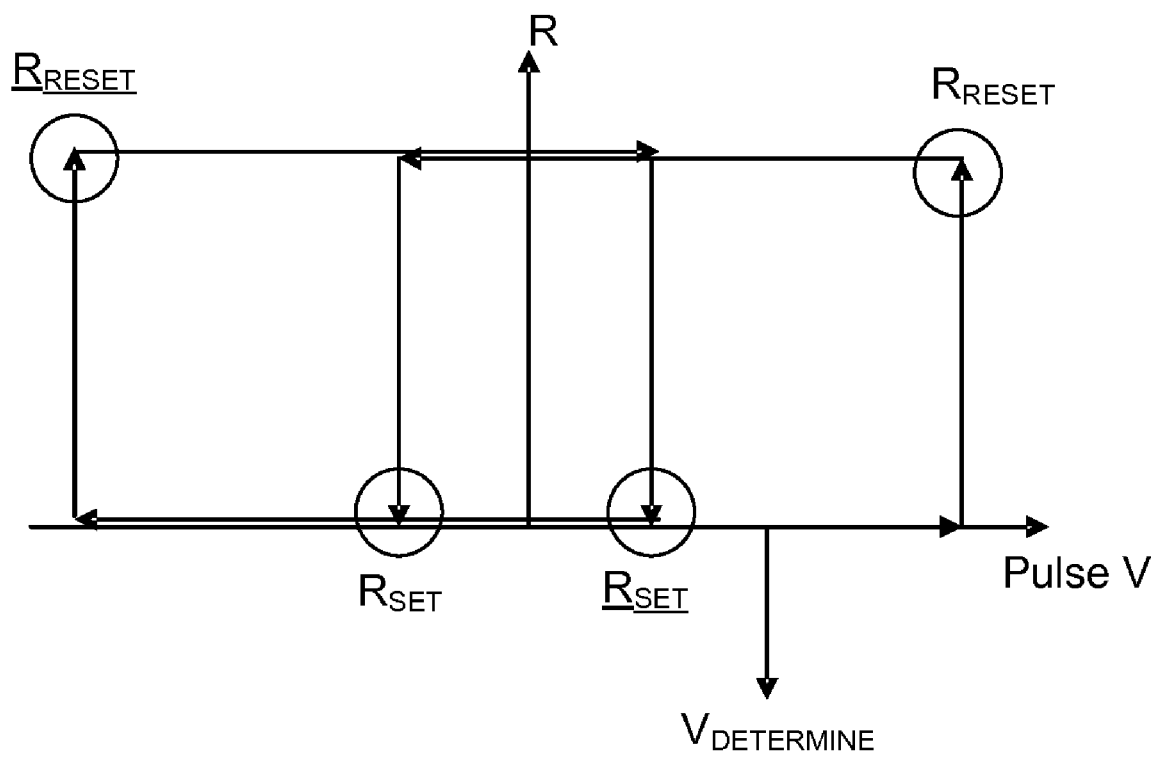
FIG. 6 shows a graphical representation of relationships between the memory states of, and applied voltages to, a symmetrical two-state embodiment of the resistance switching device shown in FIGS. 4A and 4B.
Figure 7:
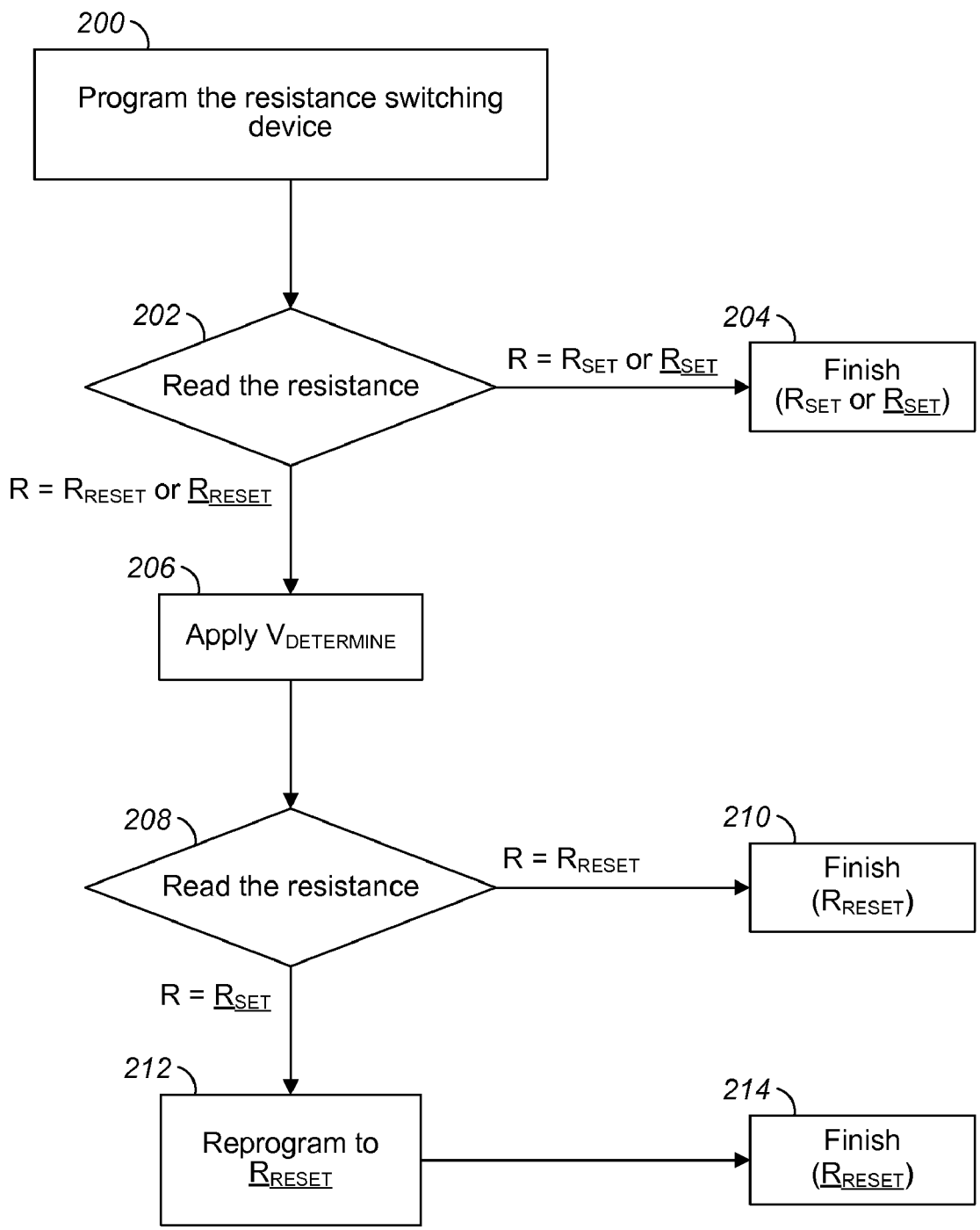
FIG. 7 shows a flowchart of a reading process for reading the symmetrical two-state embodiment of the resistance switching device shown in FIGS. 4A and 4B.

A process for reading the resistance switching device 110a according to an embodiment as a three-state memory device is next described with reference to FIGS. 6 and 7. FIG. 6 shows a graphical representation of the relationships between the memory states of, and applied voltages to, the resistance switching device 110a, and FIG. 7 shows a flowchart of the reading process.

First, at block 200, the resistance switching device 110a has been programmed to one of the memory states (1) $R_{RESET}$; (2) $\underline{R_{RESET}}$; and (3) $R_{SET}$ or $\underline{R_{SET}}$. The remainder of the process will allow for reading the resistance switching device 110a in order to determine which of the memory states was written to the resistance switching device 110a. At block 202, the resistance of the resistance switching device 110a is determined. As shown in FIG. 6, the resistance can be expected to either be a higher resistance $R_{RESET}/\underline{R_{RESET}}$ or a lower resistance $R_{SET}/\underline{R_{SET}}$ regardless of which of the first and second interface regions 138 and 140 is controlling. If the lower resistance value $R_{SET}/\underline{R_{SET}}$ is detected, the process ends at block 204 with a determination that the memory state of the resistance switching device 110a is $R_{SET}/\underline{R_{SET}}$. Otherwise, if the higher resistance $R_{RESET}/\underline{R_{RESET}}$ is detected, the process continues in order to distinguish between the $R_{RESET}$ memory state and the $\underline{R_{RESET}}$ memory state.

The memory state $R_{RESET}$ can be distinguished from the $\underline{R_{RESET}}$ memory state by determining which of the first and second interface regions 138 and 140 is controlling. In the process shown in FIG. 7, this is accomplished by applying a voltage $V_{DETERMINE}$ for which the behavior of the resistance switching device will differ depending on which of first and second interface regions 138 and 140 is controlling. An example of a voltage level that can be used as the $V_{DETERMINE}$ is shown in FIG. 6. Here, the voltage level $V_{DETERMINE}$ is a voltage level between voltage levels V3 and V4 shown in FIGS. 5A-5E. Recalling that at block 206 it is known that the resistance level is high (e.g., R1 in FIGS. 4A-4E), it can be appreciated that the behavior of the resistance memory device 110a will differ when the voltage $V_{DETERMINE}$ is applied across the resistance memory device 110a depending on which of the first and second interface regions 138 and 140 is controlling. For example, according to FIG. 5A if the second interface region 140 is controlling, then the application of voltage $V_{DETERMINE}$ will not change the resistance of the resistance memory device 110a from resistance R1. On the other hand, according to FIG. 5D if the first interface region 138 is controlling, then the application of voltage $V_{DETERMINE}$ will change the resistance of the resistance memory device 110a from resistance R1 to resistance R2.

Thus, at block 206 a voltage $V_{DETERMINE}$ is applied across the resistance switching device 110a, and then at block 208 the resistance of the resistance switching device 110a is measured. If the higher resistance value $\overline{R}_{RESET}/R_{RESET}$ is still detected, it can be determined that the second interface region 140 is controlling since the resistance value was not changed by the application of $V_{DETERMINE}$. Thus, the process ends at block 210 with a determination that the memory state of the resistance switching device 110a is the $R_{RESET}$ memory state. Otherwise, if the lower resistance value $R_{SET}/\overline{R}_{SET}$ is detected, it can be determined that the first interface region 138 was controlling since the resistance value was changed by the application of $V_{DETERMINE}$. Note that in this case, the application of $V_{DETERMINE}$ switched control from the first interface region 138 to the second interface region 140. Thus, the process continues with block 212, where switching control is switched back to the first interface region 138 so that the memory state of the resistance memory device 110a is not disturbed by the present read process. Then the process ends at block 214 with a determination that the memory state of the resistance switching device 110a is the $R_{SET}$ memory state.

Figure 8:
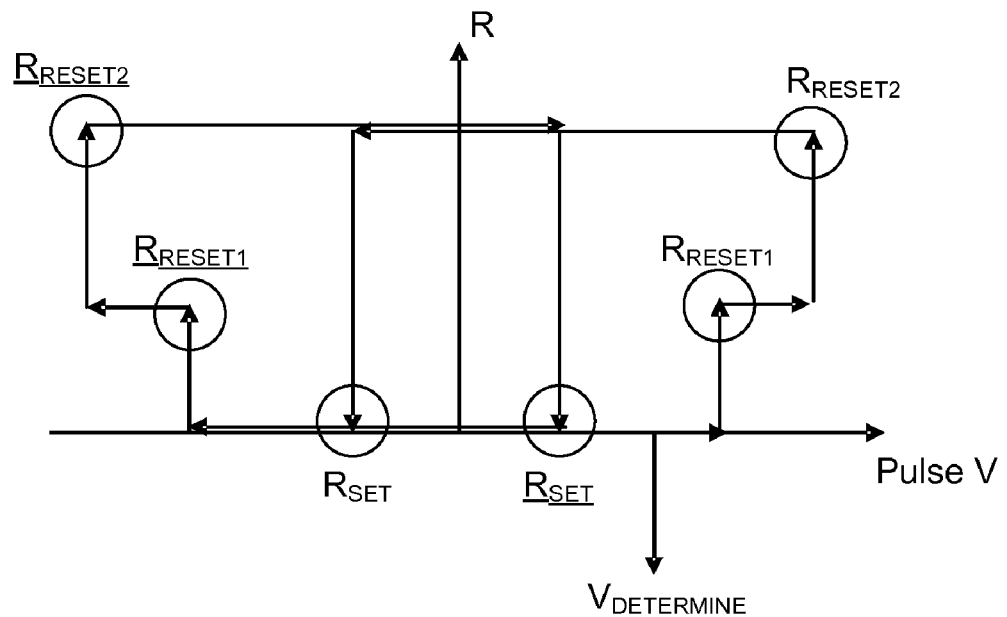
FIG. 8 shows the switching characteristics of a symmetrical three-state embodiment of the resistance switching device shown in FIGS. 4A and 4B.
Figure 9:
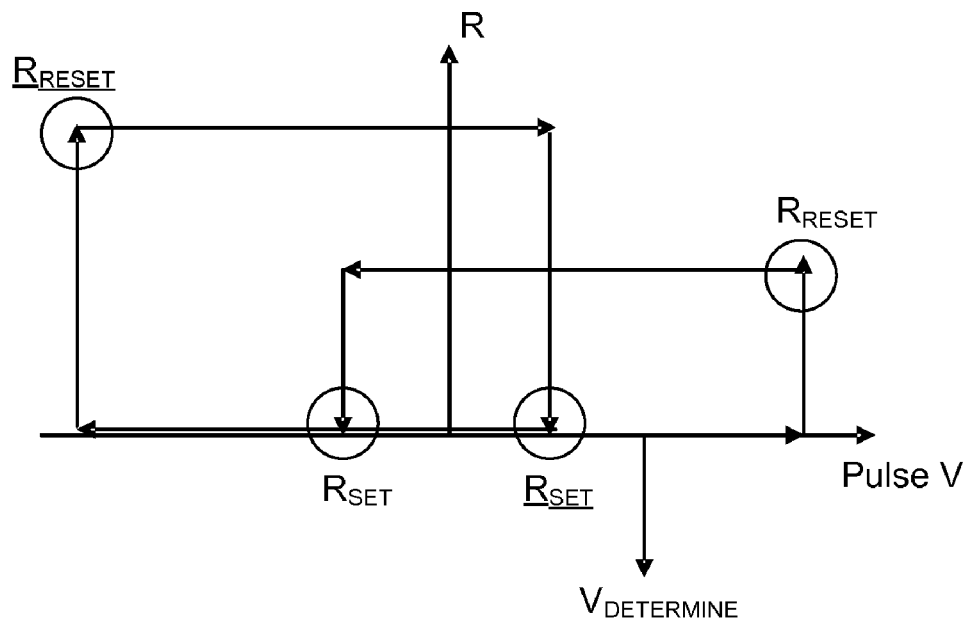
FIG. 9 shows the switching characteristics of an asymmetrical two-state embodiment of the resistance switching device shown in FIGS. 4A and 4B.
Figure 10:
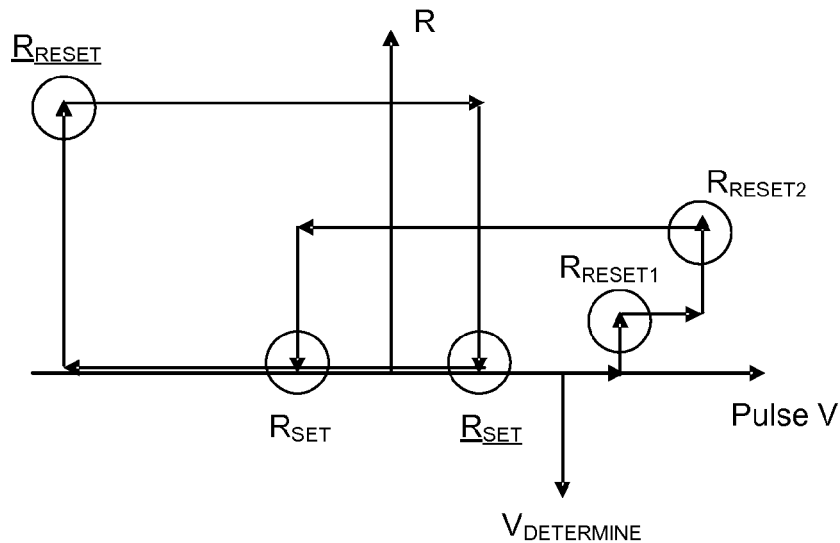
FIG. 10 shows the switching characteristics of an asymmetrical two/three-state embodiment of the resistance switching device shown in FIGS. 4A and 4B.

FIGS. 8-10 show the resistance switching characteristics of alternative embodiments of the resistance switching device 110a. More specifically, FIG. 8 shows the switching characteristics of a symmetrical three-state embodiment of the resistance switching device 110a; FIG. 9 shows the switching characteristics of an asymmetrical two-state embodiment of the resistance switching device 110a; and FIG. 10 shows the switching characteristics of an asymmetrical two/three-state embodiment of the resistance switching device 110a. These and other such alternative embodiments can be manufactured by varying the composition of the electrode layers 126 and 134 and/or the composition of the tungsten oxide layer 128. For example, where the electrode layers 126 and 134 are formed of TiN, the resistance associated with the $R_{RESET}$ or $\overline{R}_{RESET}$ state can be increased or decreased depending on the nitrogen content of the TiN. Similarly, the resistance associated with the $R_{RESET}$ or $\overline{R}_{RESET}$ state can be increased or decreased depending on the oxygen content of the tungsten oxide layer 128.

The switching characteristics of a symmetrical three-state embodiment of the resistance switching device 110a such as shown in FIG. 8 includes three resistance values (memory states) per interface region 138/140. The memory states for while the first interface region 138 is controlling are $R_{SET}$, $R_{RESET1}$, and $R_{RESET2}$. The memory states for while the second interface region 140 is controlling are $\overline{R}_{SET}$, $\overline{R}_{RESET1}$, and $\overline{R}_{RESET2}$. It is difficult to distinguish between the states $R_{SET}$ and $\overline{R}_{SET}$. However, the states $R_{RESET1}$, $R_{RESET2}$, $\overline{R}_{RESET1}$, and $\overline{R}_{RESET2}$ can be reliably distinguished from each other. Also, each of the states $R_{RESET1}$, $R_{RESET2}$, $\overline{R}_{RESET1}$, and $\overline{R}_{RESET2}$ can be reliably distinguished from the states $R_{SET}$ and $\overline{R}_{SET}$. Thus, the resistance switching device 110a according to the present embodiment can be configured to serve as a five-state memory device having states (1) $R_{RESET1}$; (2) $R_{RESET2}$; (3) $\overline{R}_{RESET1}$; (4) $\overline{R}_{RESET2}$; and (5) $R_{SET}$ or $\overline{R}_{SET}$.

The switching characteristics of an asymmetrical two-state embodiment of the resistance switching device 110a such as shown in FIG. 9 includes two resistance values (memory states) per interface region 138/140 where the $R_{RESET}$ resistance is distinguishably different from the $\overline{R}_{RESET}$ resistance. The memory states for while the first interface region 138 is controlling are $R_{SET}$ and $R_{RESET}$. The memory states for while the second interface region 140 is controlling are $\overline{R}_{SET}$ and $\overline{R}_{RESET}$. It is difficult to distinguish between the states $R_{SET}$ and $\overline{R}_{SET}$. However, the states $R_{RESET}$ and $\overline{R}_{RESET}$ can be reliably distinguished from each other. Also, each of the states $R_{RESET}$ and $\overline{R}_{RESET}$ can be reliably distinguished from the states $R_{SET}$ and $\overline{R}_{SET}$. Thus, the resistance switching device 110a according to the present embodiment can be configured to serve as a three-state memory device having states (1) $R_{RESET}$; (2) $\overline{R}_{RESET}$; and (3) $R_{SET}$ or $\overline{R}_{SET}$.

Figure 11:
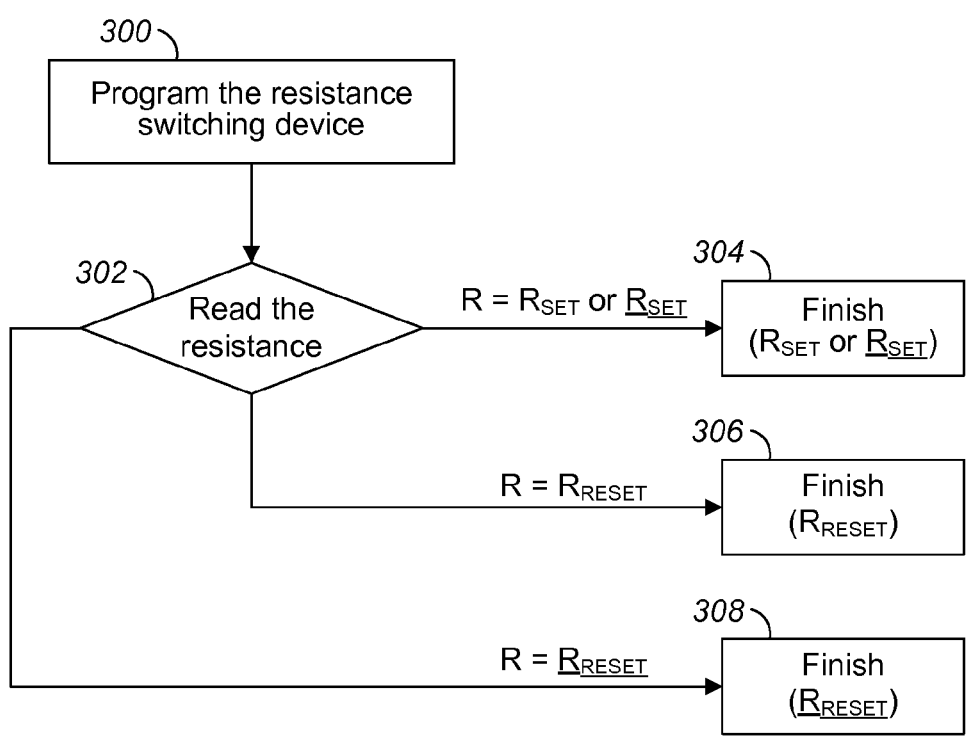
FIG. 11 shows a process for reading the resistance switching device according to the asymmetrical embodiment shown in FIG. 9.

FIG. 11 shows a process for reading the resistance switching device 110a according to the asymmetrical embodiment shown in FIG. 9. First, at block 300, the resistance switching device 110a has been programmed to one of the memory states (1) $R_{RESET}$; (2) $\overline{R}_{RESET}$; and (3) $R_{SET}$ or $\overline{R}_{SET}$. The remainder of the process will allow for reading the resistance switching device 110a in order to determine which of the memory states was written to the resistance switching device 110a. At block 302, the resistance of the resistance switching device 110a is determined. As shown in FIG. 9, the resistance can be expected to be one of a first resistance $R_{RESET}$, a second resistance $\overline{R}_{RESET}$, or a third resistance $R_{SET}/\overline{R}_{SET}$ regardless of which of the first and second interface regions 138 and 140 is controlling. If the resistance value $R_{SET}/\overline{R}_{SET}$ is detected, the process ends at block 304 with a determination that the memory state of the resistance switching device 110a is $R_{SET}/\overline{R}_{SET}$. If the resistance value $\overline{R}_{RESET}$ is detected, the process ends at block 306 with a determination that the memory state of the resistance switching device 110a is $\overline{R}_{RESET}$. If the resistance value $R_{RESET}$ is detected, the process ends at block 308 with a determination that the memory state of the resistance switching device 110a is $R_{RESET}$.

Referring again to FIG. 10, the switching characteristics of an asymmetrical two/three-state embodiment of the resistance switching device 110a includes two resistance values (memory states) associated with the first interface region 138 and three resistance values (memory states) associated with the second interface region 140. The memory states for while the first interface region 138 is controlling are $R_{SET}$ and $R_{RESET}$. The memory states for while the second interface region 140 is controlling are $\overline{R}_{SET}$, $\overline{R}_{RESET1}$, and $\overline{R}_{RESET2}$. It is difficult to distinguish between the states $R_{SET}$ and $\overline{R}_{SET}$. However, the states $R_{RESET}$, $\overline{R}_{RESET1}$, and $\overline{R}_{RESET2}$ can be reliably distinguished from each other. Also, each of the states $R_{RESET}$, $\overline{R}_{RESET1}$, and $\overline{R}_{RESET2}$ can be reliably distinguished from the states $R_{SET}$ and $\overline{R}_{SET}$. Thus, the resistance switching device 110a according to the present embodiment can be configured to serve as a four-state memory device having states (1) $R_{RESET}$; (2) $\overline{R}_{RESET1}$; (3) $\overline{R}_{RESET2}$; and (4) $R_{SET}$ or $\overline{R}_{SET}$.

Figure 12:
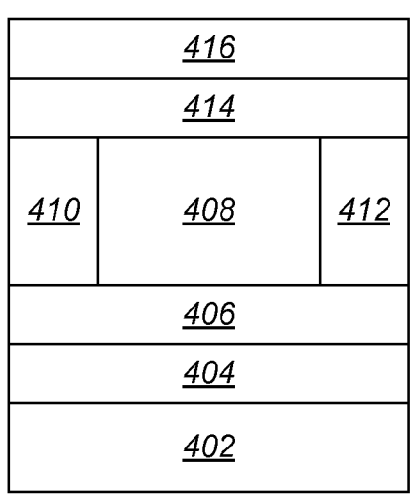
FIG. 12 shows a schematic view of a resistance switching device according to some embodiments of the resistance switching device shown in FIG. 3.

FIG. 12 shows a schematic view of a resistance switching device 110b according to some embodiments of the resistance switching device 110. The resistance switching device 110b includes a programmable metallization cell (PMC) 400. More specifically, the resistance switching device 110b includes a substrate 402, an intermetal dielectric (IMD) layer 404, a first electrode layer 406, a conductive plug layer 408, first and second dielectric layers 410 and 412, a solid electrolyte layer 414, and a second electrode layer 416.

The substrate 402 can be a silicon substrate, and the IMD layer 404 can be an oxide layer or other electrically-insulating layer formed on the substrate 402 by known methods, for example by chemical vapor deposition (CVD).

The first electrode layer 406 can be formed of titanium nitride (TiN) and disposed on the IMD layer 404 by a CVD or physical vapor deposition (PVD) process. Alternatively, the material of the first electrode 406 can include doped polysilicon, aluminum, copper, or tantalum nitride (TaN).

The conductive plug layer 408 is formed over the first electrode 406. The first and second dielectric layers 410 and 412 flank the conductive plug layer 408 and are also formed over the first electrode 406. The dielectric layers 410 and 412 can contain, for example, $SiO_2$, $Si_3N_4$, or similar insulating materials. The conductive plug layer 408 can contain tungsten. The structure comprising the conductive plug layer 408 and the first and second dielectric layers 410 and 412 can be formed by first forming the dielectric layers 410 and 412 as a continuous dielectric layer over the first electrode 406, for example by a CVD process. Next, a portion of the continuous dielectric layer is removed, for example by photolithography and etching, thereby resulting in a gap between the first and second dielectric layer formations 410 and 412. Next, the conductive plug layer 408 is formed in the gap between the first and second dielectric layers 410 and 412. More specifically, the conductive plug layer 408 can be formed by depositing the material of the conductive plug layer 408 in the gap between the first and second dielectric layers 410 and 412.

The solid electrolyte layer 414 can be formed by deposition over the conductive plug layer 408. The solid electrolyte layer 414 can also extend over the dielectric layers 410 and 412. The solid electrolyte layer 414 can include transition metal oxide or materials that contain at least one chalcogenide element. For example, the solid electrolyte layer 414 can contain GeS/Ag or GeSe/Ag.

The second electrode layer 416 can be formed by deposition over the solid electrolyte layer 414. The second electrode layer 416 can be an oxidizable electrode. The second electrode layer 416 can contain an oxidizable electrode material, for example Ag, Cu, or Zn.

Figure 13:
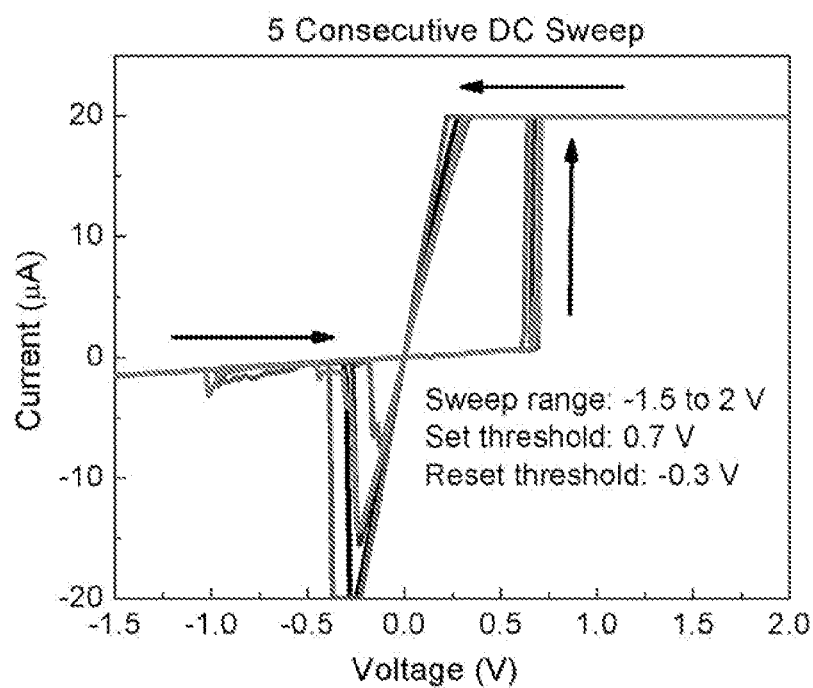
FIG. 13 shows a diagram of the voltage and current occurring during programming and read operations of the resistance switching device shown in FIG. 12.

The embodiment of the resistance switching device 110b shown in FIG. 12 forms a single PMC structure. FIG. 13 shows a diagram of the voltage and current occurring during programming and read operations of an example of the single PMC embodiment of the resistance switching device 110b. The exact voltage and current levels can vary from those shown in FIG. 13.

At the start, resistance switching device 110b may not programmed and may therefore have a high resistance. If a voltage is applied with a higher voltage at the second electrode layer 416 and a lower voltage at the first electrode layer 406, no current may flow through the resistance switching device 110b until a set threshold voltage (V1, or programming voltage) is applied. In the illustrated example, the set threshold voltage V1 may be, for example, about 0.7 volts. When the applied voltage rises over the threshold voltage V1, current may flow until a working current $I_W$ is achieved and may be confined (e.g., limited) by the programming circuit. In one embodiment, the voltage may then be reduced to 0 Volts, whereby the current falls to 0 amps, thereby completing the programming of the resistance switching device 110b.

If the cell state is to be sensed or read, a sensing voltage (VS) may be applied to the resistance switching device 110b. The sensing voltage VS may be lower than the threshold voltage V1. In the illustrated example, the sensing voltage VS may be, for example, about 0.3 volts. When the resistance switching device 110b is programmed (SET) as described above and the sensing voltage VS is applied to the resistance switching device 110b, a working current IW may flow through the resistance switching device 110b. If the resistance switching device 110b is not programmed (RESET), little or no current may flow through the resistance switching device 110b when the sensing voltage VS is applied.

In one embodiment, a lower voltage, e.g., a negative voltage (also referred to as a reset threshold voltage) may be applied to the resistance switching device 110b in order to erase or reset the program status. In the illustrated example, the reset threshold voltage may be, for example, about −0.3 volts. When the reset threshold voltage is applied to the resistance switching device 110b, a negative current may flow through the resistance switching device 110b. When the negative voltage drops to below the reset threshold voltage, the current may stop flowing (i.e., decrease to 0 Amps). After the reset threshold voltage has been applied to the resistance switching device 110b, the resistance switching device 110b may have the same high resistance as prior to the programming operation, thereby erasing or resetting the value stored in the resistance switching device 110b.

Figure 14:
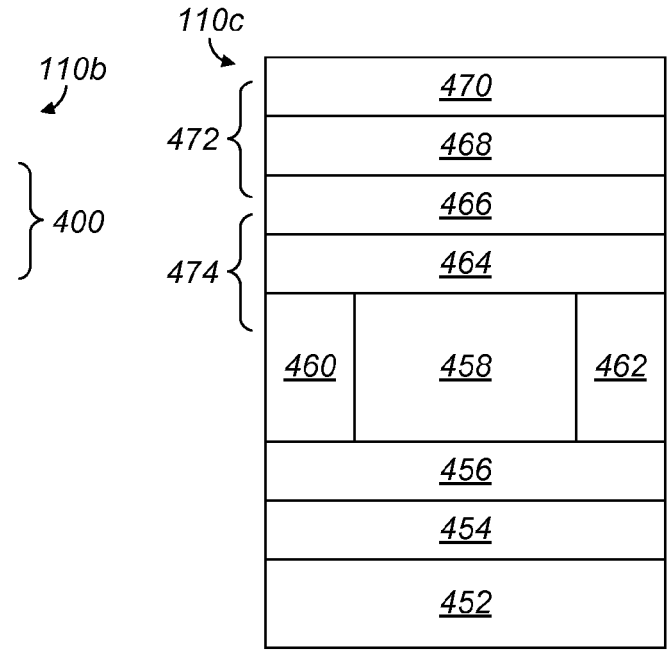
FIG. 14 shows a schematic view of a resistance switching device according to some embodiments of the resistance switching device shown in FIG. 3.

FIG. 14 shows a schematic view of a resistance switching device 110c according to some embodiments of the resistance switching device 110. The resistance switching device 110c includes a dual PMC structure. The resistance switching device 110c includes a substrate 452, an intermetal dielectric (IMD) layer 454, a first electrode layer 456, a conductive plug layer 458, first and second dielectric layers 460 and 462, a first solid electrolyte layer 464, a second electrode layer 466, a second solid electrolyte layer 468, and a third electrode layer 470.

The substrate 452 can be a silicon substrate, and the intermetal dielectric layer 454 can be an oxide layer or other electrically-insulating layer formed on the substrate 452 by known methods, for example by chemical vapor deposition (CVD).

The first electrode layer 456 can be formed of titanium nitride (TiN) and disposed on the IMD layer 454 by a CVD or physical vapor deposition (PVD) process. Alternatively, the material of the first electrode 456 can include doped polysilicon, aluminum, copper, or tantalum nitride (TaN).

The conductive plug layer 458 is formed over the first electrode 456. The first and second dielectric layers 460 and 462 flank the conductive plug layer 458 and are also formed over the first electrode 456. The dielectric layers 460 and 462 can contain, for example, $SiO_2$, $Si_3N_4$, or similar insulating materials. The conductive plug layer 458 can contain tungsten. The structure comprising the conductive plug layer 458 and the first and second dielectric layers 460 and 462 can be formed by first forming the dielectric layers 460 and 462 as a continuous dielectric layer over the first electrode 456, for example by a CVD process. Next, a portion of the continuous dielectric layer is removed, for example by photolithography and etching, thereby resulting in a gap between the first and second dielectric layer formations 460 and 462. Next, the conductive plug layer 458 is formed in the gap between the first and second dielectric layers 460 and 462. More specifically, the conductive plug layer 458 can be formed by depositing the material of the conductive plug layer 458 in the gap between the first and second dielectric layers 460 and 462.

The first solid electrolyte layer 464 can be formed by deposition over the conductive plug layer 458. The first solid electrolyte layer 464 can also extend over the dielectric layers 460 and 462. The first solid electrolyte layer 464 can include transition metal oxide or materials that contain at least one chalcogenide element. For example, the first solid electrolyte layer 464 can contain GeS/Ag or GeSe/Ag.

The second electrode layer 466 can be formed by deposition over the first solid electrolyte layer 464. The second electrode layer 466 can be an oxidizable electrode. The second electrode layer 466 can contain an oxidizable electrode material, for example Ag, Cu, or Zn.

The second solid electrolyte layer 468 can be formed by deposition over the second electrode layer 466. The second solid electrolyte layer 468 can include transition metal oxide or materials that contain at least one chalcogenide element. For example, the second solid electrolyte layer 468 can contain GeS/Ag or GeSe/Ag.

The third electrode layer 470 can be formed by deposition over the second solid electrolyte layer 468. The third electrode layer 470 can contain a conductive or semiconductive material, for example TiN.

The embodiment of the resistance switching device 110c shown in FIG. 14 forms a dual PMC structure, including upper PMC structure 472 and lower PMC structure 474. Each of the PMC structures 472 and 474 is capable of being programmed to two respective memory states corresponding to respective resistances. The memory states of the upper PMC structure 472 include memory states designated $R_{RESET}$ and $R_{SET}$, which correspond to relatively higher and lower resistance values, respectively. The memory states of the lower PMC structure 474 include memory states designated $\underline{R_{RESET}}$ and $\underline{R_{SET}}$, which correspond to relatively higher and lower resistance values, respectively. In some embodiments, the resistance value associated with $R_{RESET}$ can be substantially equal to the resistance value associated with $\underline{R_{RESET}}$, while in other embodiments the respective resistance values associated with $R_{RESET}$ and $\underline{R_{RESET}}$ can differ from each other. Similarly, in some embodiments, the resistance value associated with $R_{SET}$ can be substantially equal to the resistance value associated with $\underline{R_{SET}}$, while in other embodiments the respective resistance values associated with $R_{SET}$ and $\underline{R_{SET}}$ can differ from each other.

Figure 15A:
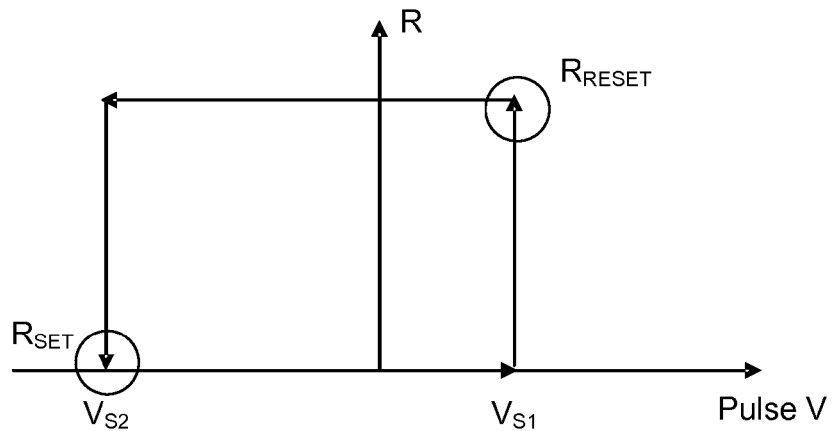
FIG. 15A shows the resistance switching characteristics of the upper PMC structure of a symmetrical, dual-PMC embodiment of the resistance switching device shown in FIG. 14.
Figure 15B:
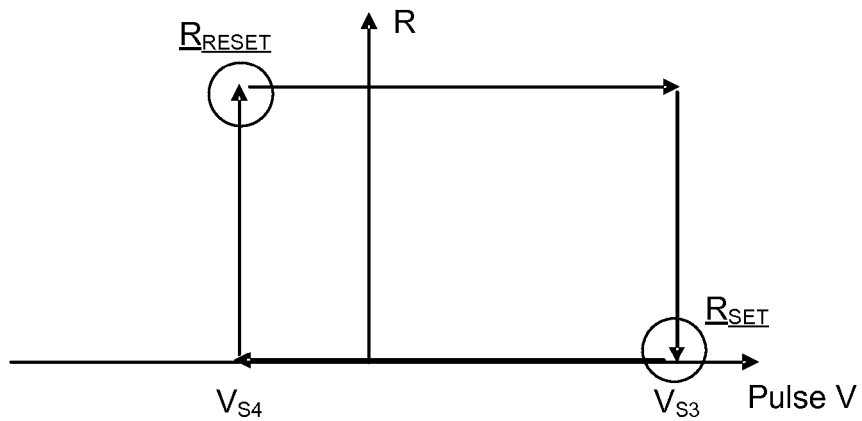
FIG. 15B shows the resistance switching characteristics of the lower PMC structure of a symmetrical, dual-PMC embodiment of the resistance switching device shown in FIG. 14.
Figure 16:
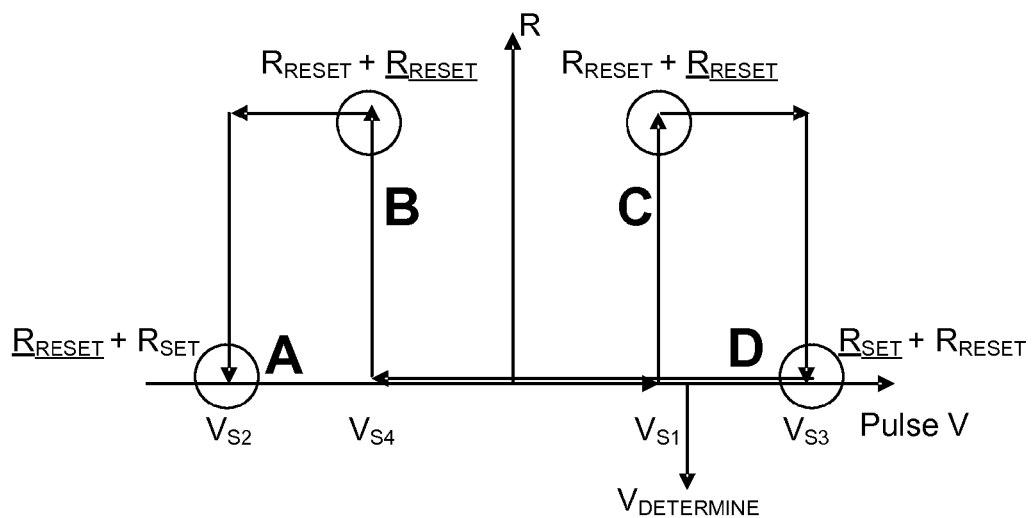
FIG. 16 shows the resistance switching characteristics of a dual-PMC structure that includes upper and lower PMC structures having the resistance switching characteristics shown in FIGS. 15A and 15B, respectively.

FIGS. 15A, 15B, and 16 show diagrams of the resistance switching characteristics of a symmetrical, dual-PMC embodiment of the resistance switching device 110c. More specifically, FIG. 15A shows the resistance switching characteristics of the upper PMC structure 472, FIG. 15B shows the resistance switching characteristics of the lower PMC structure 474, and FIG. 16 shows the overall resistance switching characteristics of the symmetrical embodiment of the dual-PMC structure that is formed by the upper and lower PMC structures 472 and 474.

As shown in FIG. 15A, a positive voltage $V_{S1}$ across the upper PMC structure 472 will cause the resistance of the upper PMC structure 472 to switch to the resistance value associated with memory state $R_{RESET}$. A negative voltage $V_{S2}$ across the upper PMC structure 472 will cause the resistance of the upper PMC structure 472 to switch to the resistance value associated with memory state $R_{SET}$.

As shown in FIG. 15B, a positive voltage $V_{S3}$ across the lower PMC structure 474 will cause the resistance of the lower PMC structure 474 to switch to the resistance value associated with memory state $\underline{R_{SET}}$. A negative voltage $V_{S4}$ across the lower PMC structure 474 will cause the resistance of the lower PMC structure 474 to switch to the resistance value associated with memory state $\underline{R_{RESET}}$.

The combination of the symmetrical embodiment of the upper and lower PMC structures 472 and 474 as shown in FIGS. 15A and 15B results in a memory device capable of four memory states A-D as shown in FIG. 16. Each of the memory states A-D is associated with a respective sum of resistances of the memory states of the upper and lower PMC structures 472 and 474. The memory state A occurs when the resistance of the upper PMC structure 472 has the resistance associated with memory state $R_{SET}$ and the lower PMC structure 474 has the resistance associated with memory state $\underline{R_{RESET}}$ so that the overall resistance of the dual PMC structure for memory state A is $R_{SET}+\underline{R_{RESET}}$. The memory state D occurs when the resistance of the upper PMC structure 472 has the resistance associated with memory state $R_{RESET}$ and the lower PMC structure 474 has the resistance associated with memory state $\underline{R_{SET}}$ so that the overall resistance of the dual PMC structure for memory state D is $R_{SET}+\underline{R_{RESET}}$. The memory states B and C both occur when the resistance of the upper PMC structure 472 has the resistance associated with memory state $R_{RESET}$ and the lower PMC structure 474 has the resistance associated with memory state $\underline{R_{RESET}}$ so that the overall resistance of the dual PMC structure for memory states B and C is $R_{RESET}+\underline{R_{RESET}}$. Thus, the memory states B and C are difficult to distinguish, so the dual PMC structure of the resistance switching device 110c can be implemented as a three-state memory device having memory states A, B (or C), and D.

Figure 17:
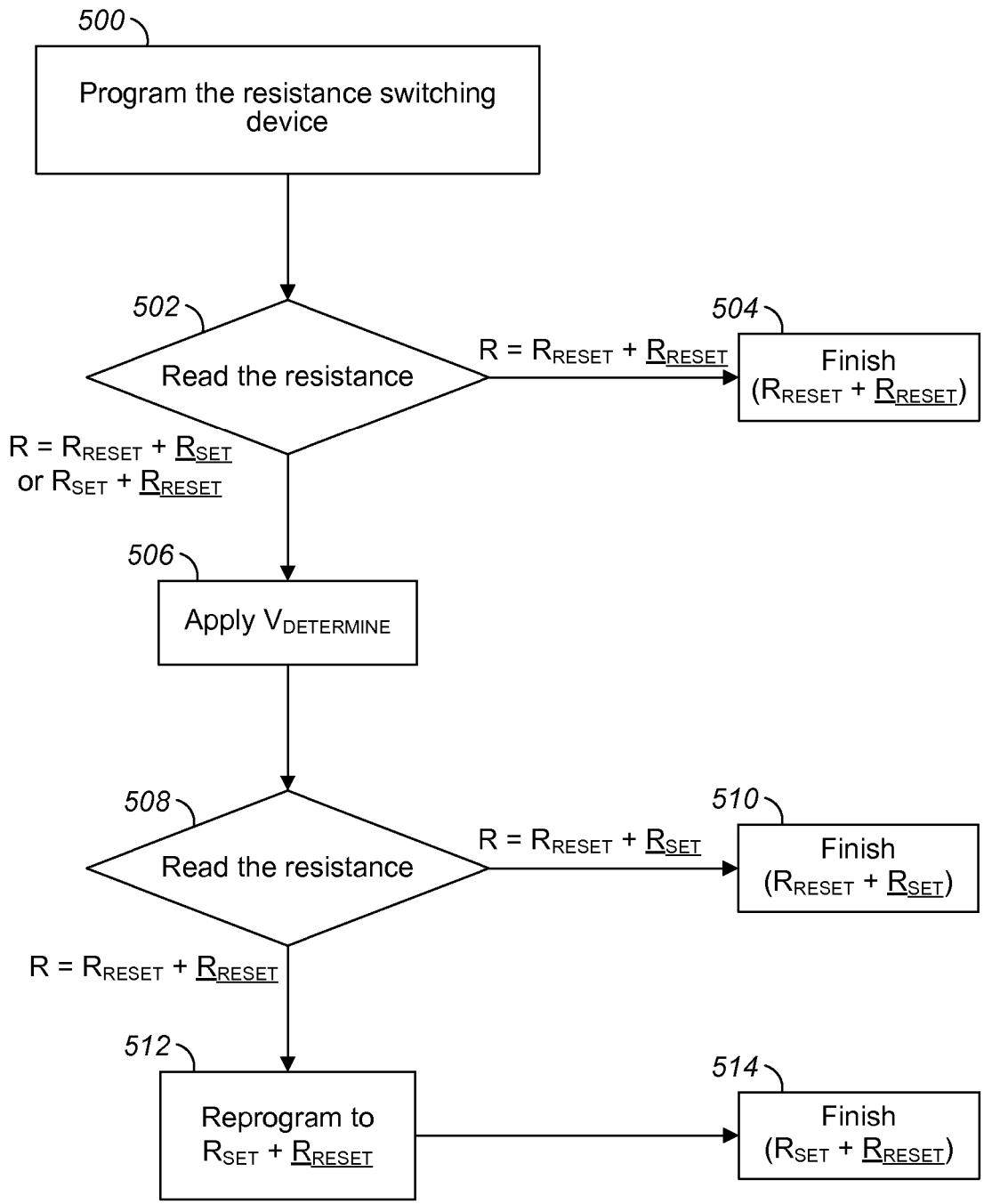
FIG. 17 shows a flowchart of a reading process for a resistance switching device shown according to FIG. 16.

A process for reading the resistance switching device 110c according to an embodiment as a three-state, symmetrical, dual-PMC memory device is next described with reference to FIG. 17, which shows a flowchart of the reading process.

First, at block 500, the resistance switching device 110c has been programmed to one of the memory states A, B/C, or D. The remainder of the process will allow for reading the resistance switching device 110c in order to determine which of the memory states was written to the resistance switching device 110c. At block 502, the resistance of the resistance switching device 110c is determined. In the present symmetrical embodiment, the resistance associated with $R_{SET}$ is substantially equal to the resistance associated with $\underline{R_{SET}}$, and the resistance associated with $R_{RESET}$ is substantially equal to the resistance associated with $\underline{R_{RESET}}$. Thus, the resistance of the resistance switching device 110c can be expected to either be a higher resistance $R=R_{RESET}+\underline{R_{RESET}}$ or a lower resistance $R=(R_{RESET}+\underline{R_{SET}})$ or $(R_{SET}+\underline{R_{RESET}})$. If the higher resistance value $R=R_{RESET}+\underline{R_{RESET}}$ is detected, the process ends at block 504 with a determination that the memory state of the resistance switching device 110c is memory state B/C ($R_{RESET}+\underline{R_{RESET}}$). Otherwise, if the lower resistance is detected, the process continues in order to distinguish between the memory states A ($R_{SET}+\underline{R_{RESET}}$) and D ($R_{RESET}+\underline{R_{SET}}$).

Next, at block 506 a voltage $V_{DETERMINE}$ is applied across the resistance switching device 110c, and then at block 508 the resistance of the resistance switching device 110c is measured. In this embodiment, a voltage for $V_{DETERMINE}$ is selected that will cause the upper PMC structure 472 to switch from $R_{SET}$ to $R_{RESET}$ if the memory state is memory state A, but will not result in any change if the memory state is memory state D. Thus, the voltage of $V_{DETERMINE}$ is a voltage between $V_{S1}$ and $V_{S3}$. Alternatively, a voltage for $V_{DETERMINE}$ can be selected between $V_{S2}$ and $V_{S4}$ that will cause the lower PMC structure 472 to switch from $\underline{R_{SET}}$ to $\underline{R_{RESET}}$ if the memory state is memory state D, but will not result in any change if the memory state is memory state A.

If the lower resistance value equal to $R_{RESET}+\underline{R_{SET}}$ (and also equal to $R_{SET}+\underline{R_{RESET}}$) is detected at block 508, it can be determined that the memory state is memory state D since the resistance value was not changed by the application of $V_{DETERMINE}$. Thus, the process ends at block 510 with a determination that the memory state of the resistance switching device 122c is the memory state D. Otherwise, if the higher resistance value $R_{RESET}+R_{RESET}$ is detected at block 508, it can be determined that the memory state is memory state A since the resistance value was changed by the application of $V_{DETERMINE}$. Note that in this case, the application of $V_{DETERMINE}$ switched the resistance value of the upper PMC structure 472 from $R_{SET}$ to $R_{RESET}$. Thus, the process continues with block 512, where the resistance of the upper PMC structure 472 is switched back to $R_{SET}$ (e.g., by application of $V_{S2}$) so that the memory state of the resistance memory device 122c is not disturbed by the present read process. Then the process ends at block 514 with a determination that the memory state of the resistance switching device 122c is the memory state A.

Figure 18:
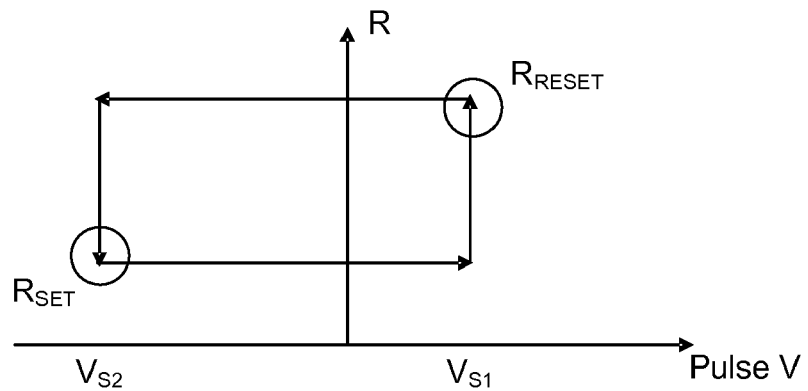
FIG. 18 shows the resistance switching characteristics of the upper PMC structure of an asymmetrical, dual-PMC embodiment of the resistance switching device shown in FIG. 14.
Figure 19:
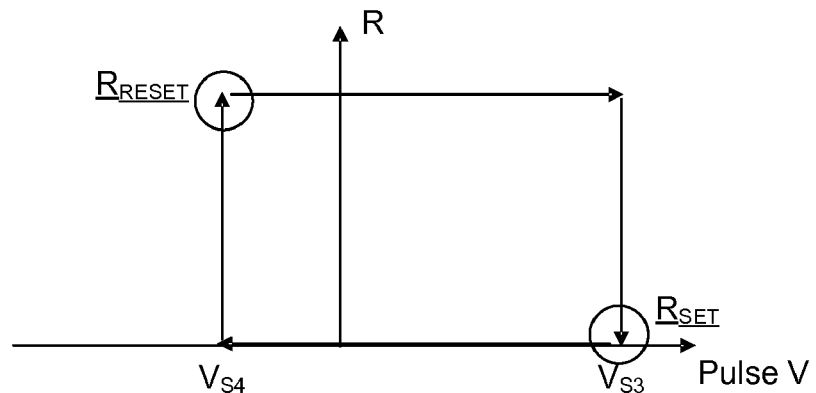
FIG. 19 shows the resistance switching characteristics of the lower PMC structure of an asymmetrical, dual-PMC embodiment of the resistance switching device shown in FIG. 14.
Figure 20:
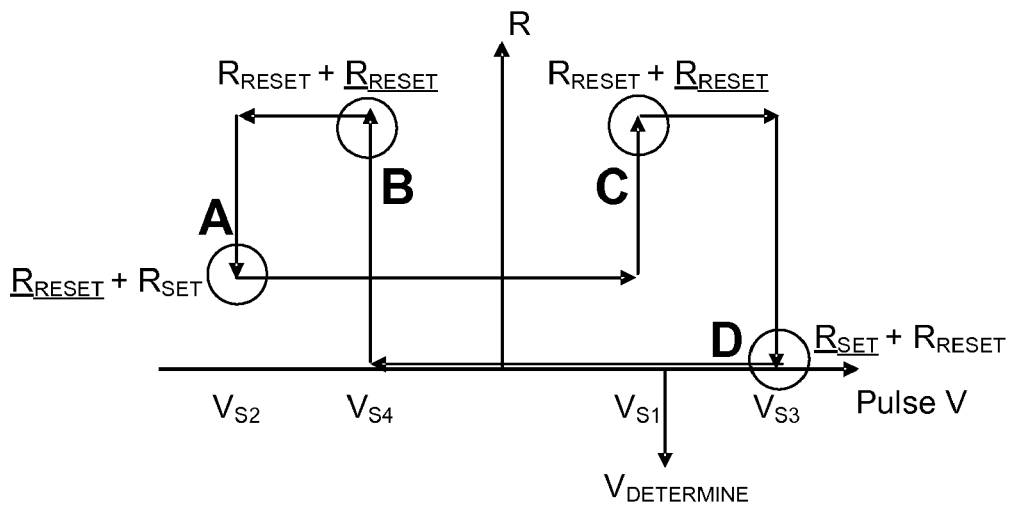
FIG. 20 shows the resistance switching characteristics of a dual-PMC structure that includes upper and lower PMC structures having the resistance switching characteristics shown in FIGS. 18 and 19, respectively.

FIGS. 18-20 show diagrams of the resistance switching characteristics of an asymmetrical, dual-PMC embodiment of the resistance switching device 110c. More specifically, FIG. 18 shows the resistance switching characteristics of the upper PMC structure 472, FIG. 19 shows the resistance switching characteristics of the lower PMC structure 474, and FIG. 20 shows the overall resistance switching characteristics of the asymmetrical embodiment of the dual-PMC structure that is formed by the upper and lower PMC structures 472 and 474.

As shown in FIG. 18, a positive voltage $V_{S1}$ across the upper PMC structure 472 will cause the resistance of the upper PMC structure 472 to switch to the resistance value associated with memory state $R_{RESET}$. A negative voltage $V_{S2}$ across the upper PMC structure 472 will cause the resistance of the upper PMC structure 472 to switch to the resistance value associated with memory state $R_{SET}$.

As shown in FIG. 19, a positive voltage $V_{S3}$ across the lower PMC structure 474 will cause the resistance of the lower PMC structure 474 to switch to the resistance value associated with memory state $R_{SET}$. A negative voltage $V_{S4}$ across the lower PMC structure 474 will cause the resistance of the lower PMC structure 474 to switch to the resistance value associated with memory state $R_{RESET}$.

The combination of the asymmetrical embodiment of the upper and lower PMC structures 472 and 474 as shown in FIGS. 18 and 19 results in a memory device capable of four memory states A-D as shown in FIG. 20. Each of the memory states A-D is associated with a respective sum of resistances of the memory states of the upper and lower PMC structures 472 and 474. The memory state A occurs when the resistance of the upper PMC structure 472 has the resistance associated with memory state $R_{SET}$ and the lower PMC structure 474 has the resistance associated with memory state $R_{RESET}$ so that the overall resistance of the dual PMC structure for memory state A is $R_{SET}+R_{RESET}$. The memory state D occurs when the resistance of the upper PMC structure 472 has the resistance associated with memory state $R_{RESET}$ and the lower PMC structure 474 has the resistance associated with memory state $R_{SET}$ so that the overall resistance of the dual PMC structure for memory state D is $R_{SET}+R_{RESET}$. The memory states B and C both occur when the resistance of the upper PMC structure 472 has the resistance associated with memory state $R_{RESET}$ and the lower PMC structure 474 has the resistance associated with memory state $R_{RESET}$ so that the overall resistance of the dual PMC structure for memory states B and C is $R_{RESET}+R_{RESET}$. Thus, the memory states B and C are difficult to distinguish, so the dual PMC structure of the resistance switching device 110c can be implemented as a three-state memory device having memory states A, B (or C), and D.

Figure 21:
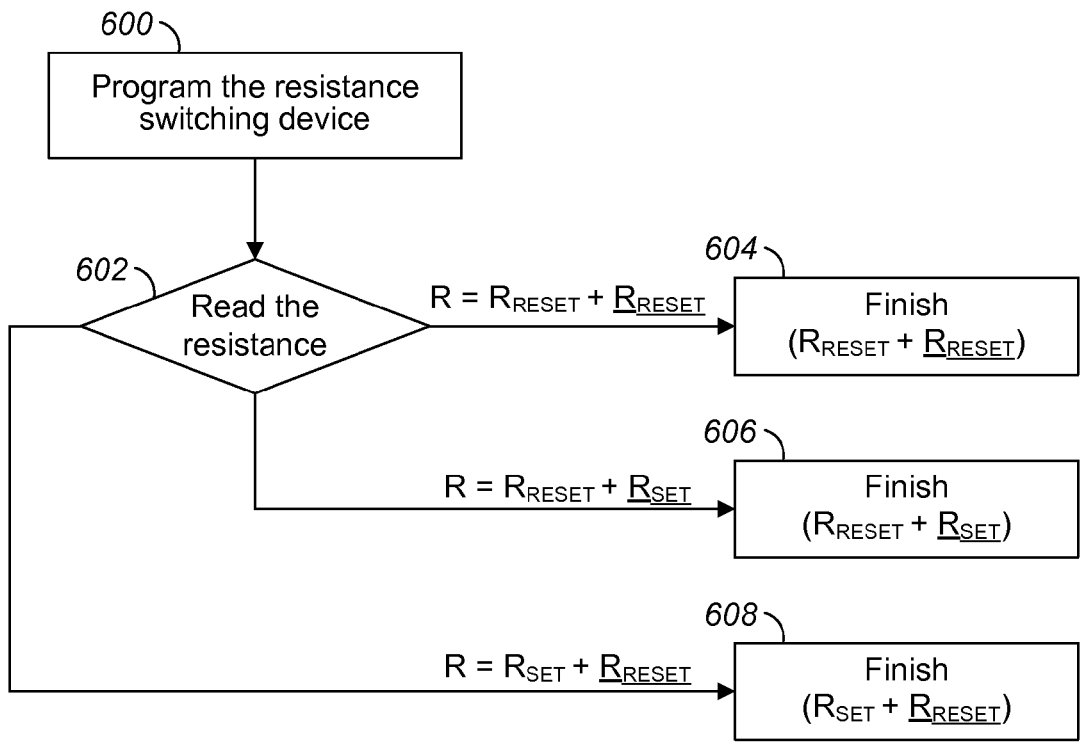
FIG. 21 shows a flowchart of a reading process for a resistance switching device shown according to FIG. 20.

FIG. 21 shows an alternative process for reading the resistance switching device 110c according to the asymmetrical embodiment having asymmetrical resistance switching characteristics as shown in FIGS. 18-20. First, at block 600, the resistance switching device 110c has been programmed to one of the memory states A, B/C, or D. The remainder of the process will allow for reading the resistance switching device 110c in order to determine which of the memory states A, B/C, or D was written to the resistance switching device 110c. At block 602, the resistance of the resistance switching device 110c is determined. As shown in FIG. 20, the resistance can be expected to be one of the resistance values associated with memory states A ($R_{SET}+R_{RESET}$), B/C ($R_{RESET}+R_{RESET}$), or D ($R_{SET}+R_{RESET}$). If the resistance value $R_{RESET}+R_{RESET}$ is detected, the process ends at block 604 with a determination that the memory state of the resistance switching device 110c is memory state B/C. If the resistance value $R_{SET}+R_{RESET}$ is detected, the process ends at block 606 with a determination that the memory state of the resistance switching device 110c is memory state D. If the resistance value $R_{SET}+R_{RESET}$ is detected, the process ends at block 608 with a determination that the memory state of the resistance switching device 110c is memory state A.

Figure 22:
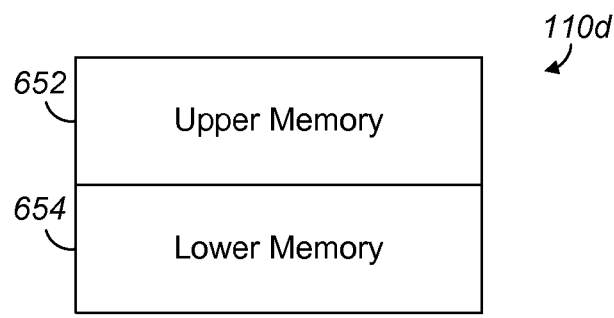
FIG. 22 shows a schematic view of a resistance switching device according to some embodiments of the resistance switching device shown in FIG. 3.

In addition to the foregoing embodiments 110a, 110b, and 110c of the resistance switching device 110, it will be appreciated that there are many still further embodiments that are possible for the resistance switching device 110. FIG. 22 shows a block diagram of a more generalized embodiment, generally referred to as resistance switching device 110d. The resistance switching device 110d includes an upper memory structure 652 and a lower memory structure 654, where each of the memory structures 652 and 654 include a respective semiconductor resistance-switching memory device. For example, the upper memory structure 652 can include a PMC, a Resistive Random Access Memory (RRAM), a Magnetoresistive Random Access Memory (MRAM), a phase-change memory (PCM), or a Ferroelectric Random Access Memory (FRAM). Similarly, the lower memory structure 654 can include a PMC, an RRAM, an MRAM, or an FRAM. Alternatively, the upper and lower memory structures 652 and 654 can include any electronic memory device capable of switching between two resistance values (corresponding to two memory states).

The memory states of the upper memory structure 652 include memory states designated $R_{RESET}$ and $R_{SET}$, which correspond to relatively higher and lower resistance values, respectively. A positive reset voltage ($+V_{RESET}$) can switch the resistance of the upper memory structure 652 to the resistance $R_{RESET}$, and a negative set voltage ($-V_{SET}$) can switch the resistance of the upper memory structure 652 to the resistance $R_{SET}$. The memory states of the lower memory structure 654 include memory states designated $R_{RESET}$ and $R_{SET}$, which correspond to relatively higher and lower resistance values, respectively. A negative reset voltage ($-V_{RESET}$) can switch the resistance of the upper memory structure 652 to the resistance $R_{RESET}$, and a positive set voltage ($+V_{SET}$) can switch the resistance of the upper memory structure 652 to the resistance $R_{SET}$. There are two desirable condition sets for the resistance switching device 110d. The first condition set satisfies both the following conditions (1a) and (1b):

$$+V_{RESET} > +V_{SET} \tag{1a}$$

$$|-V_{SET}| > |-V_{RESET}| \tag{1b}$$

The second condition set satisfies both the following conditions (2a) and (2b):

$$+V_{RESET} < +V_{SET} \tag{2a}$$

$$|-V_{SET}| < |-V_{RESET}| \tag{2b}$$

Embodiments of the resistance switching device 110d that satisfy the first condition set are described with reference to FIGS. 23-25. Embodiments of the resistance switching device 110d that satisfy the second condition set are described with reference to FIGS. 27-30.

Figure 23:
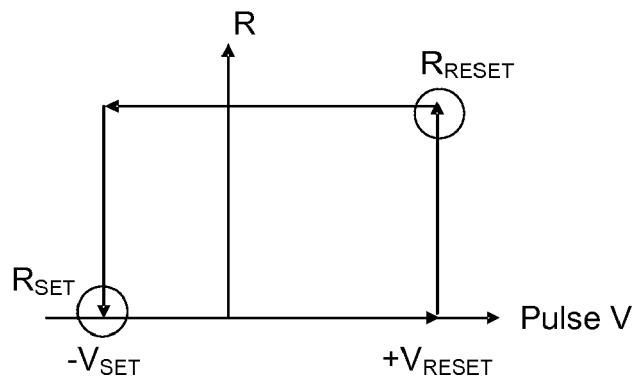
FIG. 23 shows the resistance switching characteristics of the upper memory structure of an embodiment of the resistance switching device shown in FIG. 22.
Figure 24:
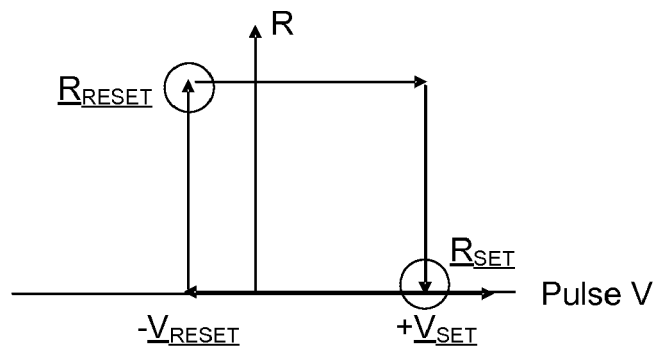
FIG. 24 shows the resistance switching characteristics of the lower memory structure of an embodiment of the resistance switching device shown in FIG. 22.
Figure 25:
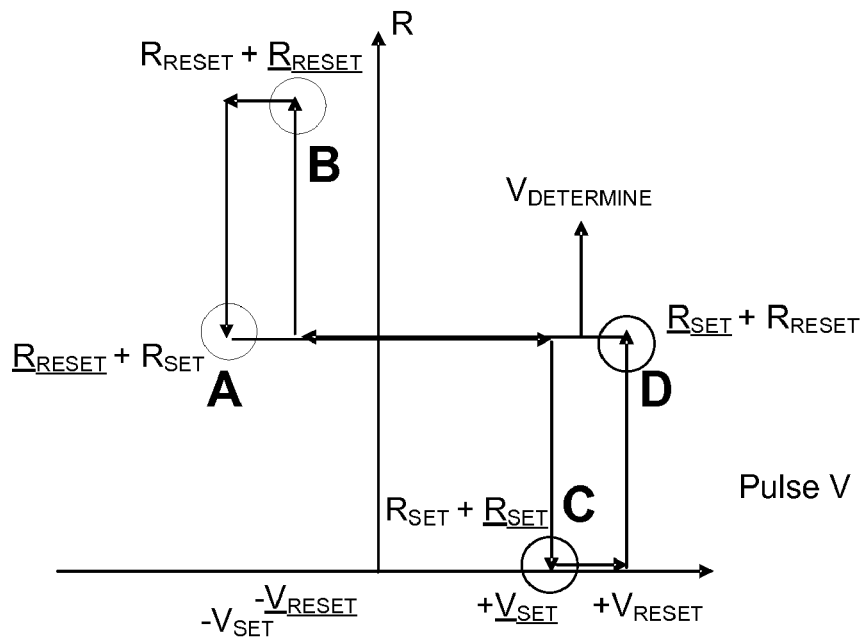
FIG. 25 shows the resistance switching characteristics of a resistance switching device that includes upper and lower memory structures having the resistance switching characteristics shown in FIGS. 23 and 24, respectively.

FIGS. 23-25 show diagrams of the resistance switching characteristics of an embodiment of the resistance switching device 110d satisfying the first set of conditions (1a) and (1b). More specifically, FIG. 23 shows the resistance switching characteristics of the upper memory structure 652, FIG. 24 shows the resistance switching characteristics of the lower memory structure 654, and FIG. 25 shows the overall resistance switching characteristics of the resistance switching device 110d according to the present embodiment.

As shown in FIG. 23, a positive voltage $+V_{RESET}$ across the upper memory structure 652 will cause the resistance of the upper memory structure 652 to switch to the resistance value associated with memory state $R_{RESET}$. A negative voltage $-V_{SET}$ across the upper memory structure 652 will cause the resistance of the upper memory structure 652 to switch to the resistance value associated with memory state $R_{SET}$.

As shown in FIG. 24, a positive voltage $+V_{SET}$ across the lower memory structure 654 will cause the resistance of the lower memory structure 654 to switch to the resistance value associated with memory state $R_{SET}$. A negative voltage $-V_{RESET}$ across the lower memory structure 654 will cause the resistance of the lower memory structure 654 to switch to the resistance value associated with memory state $R_{RESET}$.

The combination of the upper and lower memory structures 652 and 654 as shown in FIGS. 23 and 24 results in a resistance switching device 110d capable of four memory states A-D as shown in FIG. 25. Each of the memory states A-D is associated with a respective sum of resistances of the memory states of the upper and lower memory structures 652 and 654. The memory state A occurs when the resistance of the upper memory structure 652 has the resistance associated with memory state $R_{SET}$ and the lower memory structure 654 has the resistance associated with memory state $R_{RESET}$ so that the overall resistance of the resistance switching device 122d for memory state A is $R_{SET}+R_{RESET}$. The memory state B occurs when the resistance of the upper memory structure 652 has the resistance associated with memory state $R_{RESET}$ and the lower memory structure 654 has the resistance associated with memory state $R_{RESET}$ so that the overall resistance of the resistance switching device 110d for memory state B is $R_{RESET}R+R_{RESET}$. The memory state C occurs when the resistance of the upper memory structure 652 has the resistance associated with memory state $R_{SET}$ and the lower memory structure 654 has the resistance associated with memory state $R_{SET}$ so that the overall resistance of the resistance switching device 110d for memory state C is $R_{SET}+R_{SET}$. The memory state D occurs when the resistance of the upper memory structure 652 has the resistance associated with memory state $R_{RESET}$ and the lower memory structure 654 has the resistance associated with memory state $R_{SET}$ so that the overall resistance of the resistance switching device 110d for memory state D is $R_{SET}+R_{RESET}$. Thus, the resistance switching device 110d can be implemented as a four-state memory device having memory states A, B, C, and D.

Figure 26:
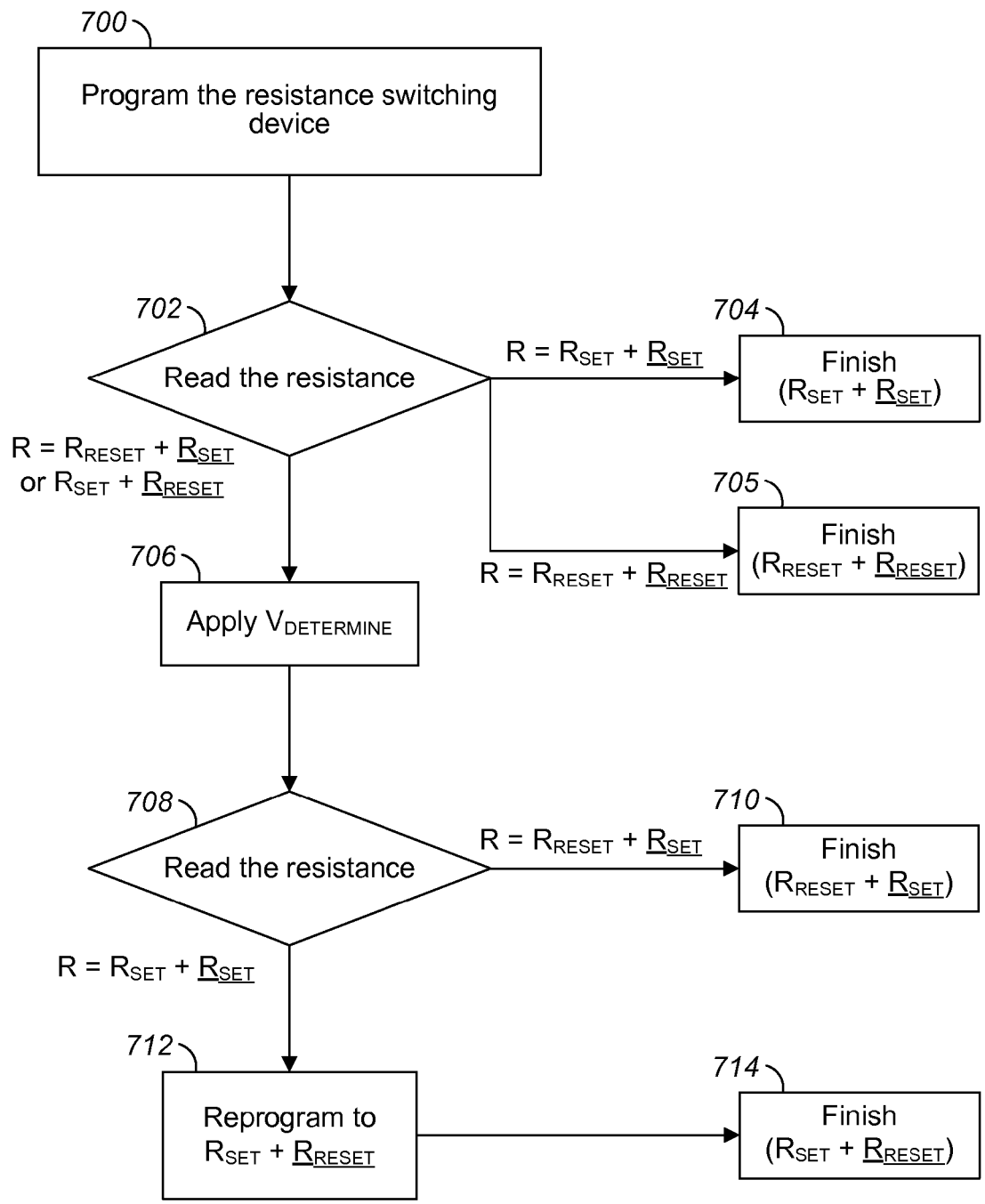
FIG. 26 shows a flowchart of a reading process for a resistance switching device shown according to FIG. 25.

A process for reading the resistance switching device 110d according to an embodiment as a four-state memory device satisfying the first set of conditions (1a) and (1b) is next described with reference to FIG. 26, which shows a flowchart of the reading process.

First, at block 700, the resistance switching device 110d has been programmed to one of the memory states A, B, C, or D. The remainder of the process will allow for reading the resistance switching device 110d in order to determine which of the memory states A-D was written to the resistance switching device 110d. At block 702, the resistance of the resistance switching device 110d is determined. The resistance of the resistance switching device 110d can be expected to one of the four resistance values associated with the memory states A-D, respectively. If the resistance value $R=R_{SET}+R_{SET}$ is detected, the process ends at block 704 with a determination that the memory state of the resistance switching device 110d is memory state C ($R_{SET}+R_{SET}$). If the resistance value $R=R_{RESET}+R_{RESET}$ is detected, the process ends at block 705 with a determination that the memory state of the resistance switching device 110d is memory state B ($R_{RESET}+R_{RESET}$). In the present embodiment, the resistance associated with $R_{SET}$ is substantially equal to the resistance associated with $R_{SET}$, and the resistance associated with $R_{RESET}$ is substantially equal to the resistance associated with $R_{RESET}$. Thus, a third possibility at block 702 is that the resistance is $R=R_{RESET}+R_{SET}=R_{SET}+R_{RESET}$. If this third possibility occurs, then the process continues in order to distinguish between the memory states A ($R_{SET}+R_{RESET}$) and D ($R_{RESET}+R_{SET}$).

Next, at block 706 a voltage $V_{DETERMINE}$ is applied across the resistance switching device 110d, and then at block 708 the resistance of the resistance switching device 110d is measured. In this embodiment, a voltage for $V_{DETERMINE}$ is selected that will cause the lower memory structure 654 to switch from $R_{RESET}$ to $R_{SET}$ if the memory state is memory state A, but will not result in any change if the memory state is memory state D. Thus, the voltage of $V_{DETERMINE}$ is a voltage between $+V_{SET}$ and $+V_{RESET}$.

At block 708, the resistance of the resistance switching device 110d is again determined. If the detected resistance at block 708 is $R=R_{RESET}+R_{SET}$, it can be determined that the memory state is memory state D since the resistance value was not changed by the application of $V_{DETERMINE}$. Thus, the process ends at block 710 with a determination that the memory state of the resistance switching device 110d is the memory state D. Otherwise, if the detected resistance at block 708 is $R=R_{RESET}+R_{SET}$, it can be determined that the memory state is memory state A since the resistance value was changed by the application of $V_{DETERMINE}$. Note that in this case, the application of $V_{DETERMINE}$ switched the resistance value of the lower memory structure 654 from $R_{RESET}$ to $R_{SET}$. Thus, the process continues with block 712, where the resistance of the lower memory structure 654 is switched back to $R_{RESET}$ (e.g., by application of $-V_{RESET}$) so that the memory state of the resistance memory device 110d is not disturbed by the present read process. Then the process ends at block 714 with a determination that the memory state of the resistance switching device 110d is the memory state A.

Figure 27:
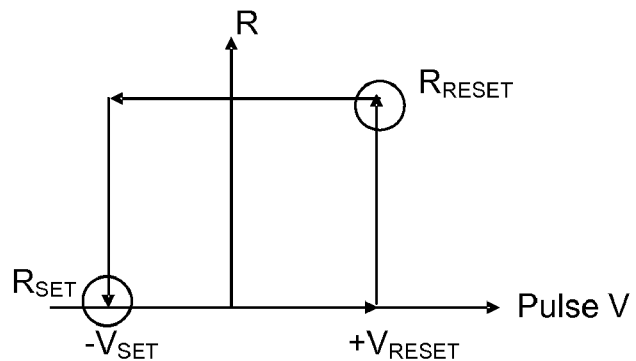
FIG. 27 shows the resistance switching characteristics of the upper memory structure of an embodiment of the resistance switching device shown in FIG. 22.
Figure 28:
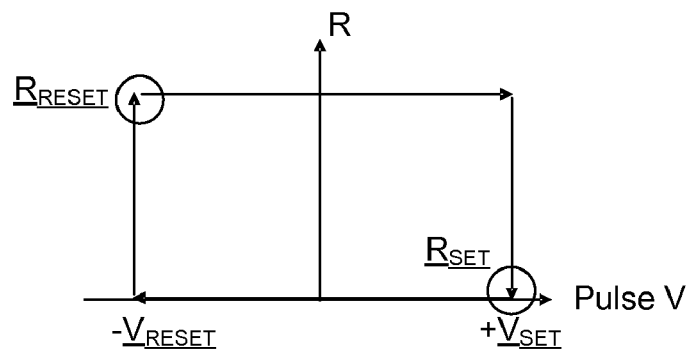
FIG. 28 shows the resistance switching characteristics of the lower memory structure of an embodiment of the resistance switching device shown in FIG. 22.
Figure 29:
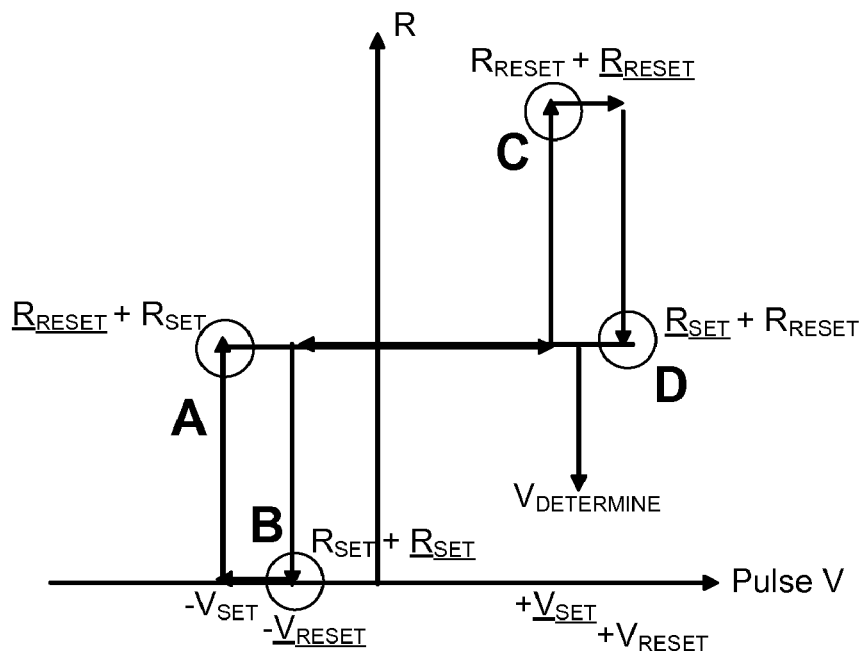
FIG. 29 shows the resistance switching characteristics of a resistance switching device that includes upper and lower memory structures having the resistance switching characteristics shown in FIGS. 27 and 28, respectively.

FIGS. 27-29 show diagrams of the resistance switching characteristics of an embodiment of the resistance switching device 110d satisfying the above second set of conditions (2a) and (2b). More specifically, FIG. 27 shows the resistance switching characteristics of the upper memory structure 652, FIG. 28 shows the resistance switching characteristics of the lower memory structure 654, and FIG. 29 shows the overall resistance switching characteristics of the resistance switching device 110d according to the present embodiment.

As shown in FIG. 27, a positive voltage $+V_{RESET}$ across the upper memory structure 652 will cause the resistance of the upper memory structure 652 to switch to the resistance value associated with memory state $R_{RESET}$. A negative voltage $-V_{SET}$ across the upper memory structure 652 will cause the resistance of the upper memory structure 652 to switch to the resistance value associated with memory state $R_{SET}$.

As shown in FIG. 28, a positive voltage +$V_{SET}$ across the lower memory structure 654 will cause the resistance of the lower memory structure 654 to switch to the resistance value associated with memory state $R_{SET}$. A negative voltage −$V_{RESET}$ across the lower memory structure 654 will cause the resistance of the lower memory structure 654 to switch to the resistance value associated with memory state $R_{RESET}$.

The combination of the upper and lower memory structures 652 and 654 as shown in FIGS. 27 and 28 results in a resistance switching device 110$d$ capable of four memory states A-D as shown in FIG. 29. Each of the memory states A-D is associated with a respective sum of resistances of the memory states of the upper and lower memory structures 652 and 654. The memory state A occurs when the resistance of the upper memory structure 652 has the resistance associated with memory state $R_{SET}$ and the lower memory structure 654 has the resistance associated with memory state $R_{RESET}$ so that the overall resistance of the resistance switching device 110$d$ for memory state A is $R_{SET}+R_{RESET}$. The memory state B occurs when the resistance of the upper memory structure 652 has the resistance associated with memory state $R_{SET}$ and the lower memory structure 654 has the resistance associated with memory state $R_{SET}$ so that the overall resistance of the resistance switching device 110$d$ for memory state B is $R_{SET}+R_{SET}$. The memory state C occurs when the resistance of the upper memory structure 652 has the resistance associated with memory state $R_{RESET}$ and the lower memory structure 654 has the resistance associated with memory state RESET so that the overall resistance of the resistance switching device 110$d$ for memory state C is $R_{RESET}+R_{RESET}$. The memory state D occurs when the resistance of the upper memory structure 652 has the resistance associated with memory state $R_{RESET}$ and the lower memory structure 654 has the resistance associated with memory state $R_{SET}$ so that the overall resistance of the resistance switching device 110$d$ for memory state D is $R_{SET}+R_{RESET}$. Thus, the resistance switching device 110$d$ can be implemented as a four-state memory device having memory states A, B, C, and D.

Figure 30:
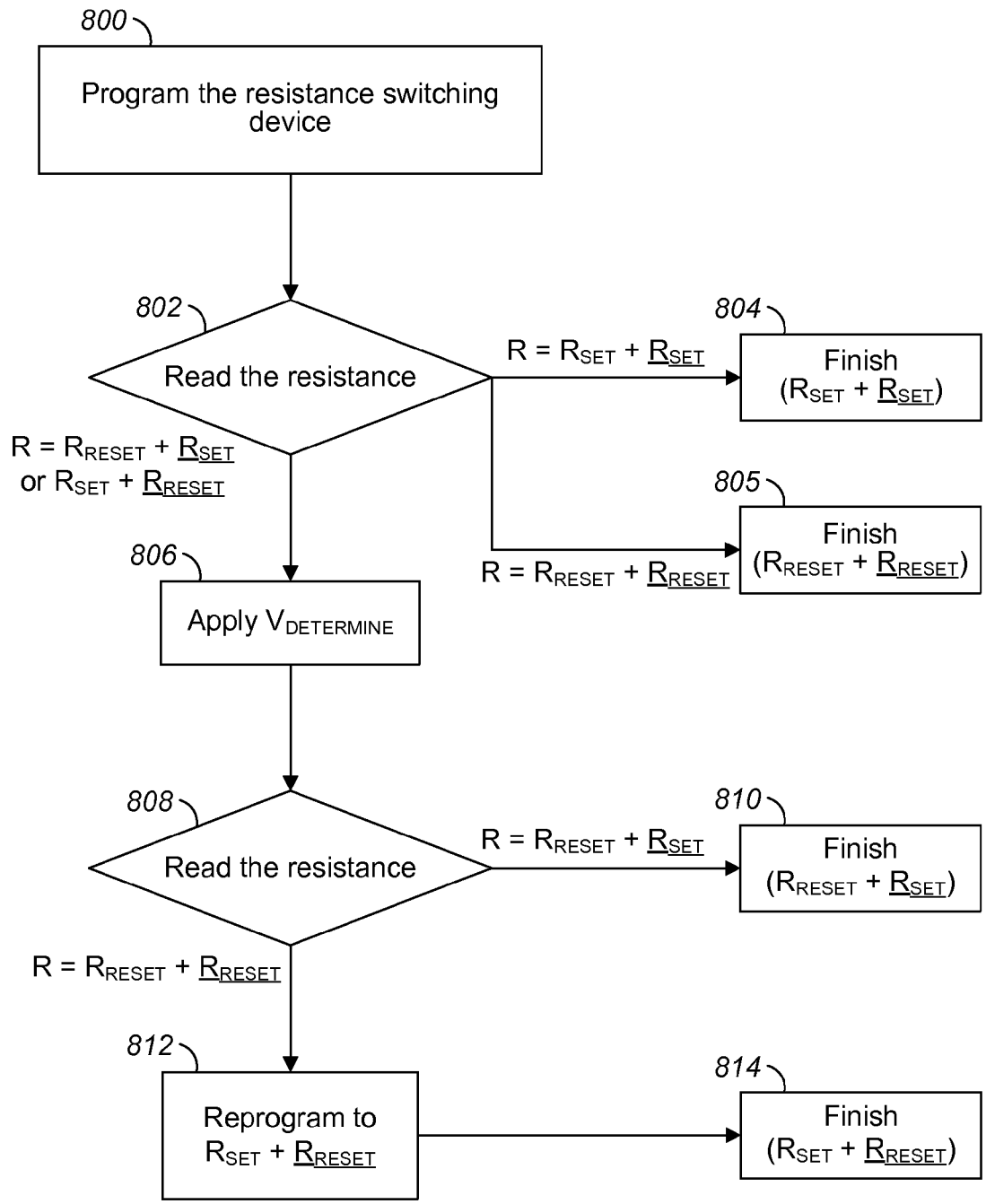
FIG. 30 shows a flowchart of a reading process for a resistance switching device shown according to FIG. 29.

A process for reading the resistance switching device 110$d$ according to an embodiment as a four-state memory device satisfying the second set of conditions (2a) and (2b) is next described with reference to FIG. 30, which shows a flowchart of the reading process.

First, at block 800, the resistance switching device 110$d$ has been programmed to one of the memory states A, B, C, or D. The remainder of the process will allow for reading the resistance switching device 110$d$ in order to determine which of the memory states A-D was written to the resistance switching device 110$d$.

At block 802, the resistance of the resistance switching device 110$d$ is determined. The resistance of the resistance switching device 110$d$ can be expected to one of the four resistance values associated with the memory states A-D, respectively. If the resistance value R=$R_{SET}+R_{SET}$ is detected, the process ends at block 804 with a determination that the memory state of the resistance switching device 110$d$ is memory state B ($R_{SET}+R_{SET}$). If the resistance value R=$R_{RESET}+R_{RESET}$ is detected, the process ends at block 805 with a determination that the memory state of the resistance switching device 110$d$ is memory state C ($R_{RESET}+R_{RESET}$).

In the present embodiment, the resistance associated with $R_{SET}$ is substantially equal to the resistance associated with $R_{SET}$, and the resistance associated with $R_{RESET}$ is substantially equal to the resistance associated with $R_{RESET}$. Thus, a third possibility at block 802 is that the resistance is R=$R_{RESET}+R_{SET}=R_{SET}+R_{RESET}$. If this third possibility occurs, then the process continues in order to distinguish between the memory states A ($R_{SET}+R_{RESET}$) and D ($R_{RESET}+R_{SET}$).

Next, at block 806 a voltage $V_{DETERMINE}$ is applied across the resistance switching device 110$d$, and then at block 808 the resistance of the resistance switching device 110$d$ is measured. In this embodiment, a voltage for $V_{DETERMINE}$ is selected that will cause the upper memory structure 652 to switch from $R_{SET}$ to $R_{RESET}$ if the memory state is memory state A, but will not result in any change if the memory state is memory state D. Thus, the voltage of $V_{DETERMINE}$ is a voltage between +$V_{RESET}$ and +$V_{SET}$.

At block 808, the resistance of the resistance switching device 110$d$ is again determined. If the detected resistance at block 808 is R=$R_{RESET}+R_{SET}$, it can be determined that the memory state is memory state D since the resistance value was not changed by the application of $V_{DETERMINE}$. Thus, the process ends at block 810 with a determination that the memory state of the resistance switching device 110$d$ is the memory state D. Otherwise, if the detected resistance at block 808 is R=$R_{RESET}+R_{RESET}$, it can be determined that the memory state is memory state A since the resistance value was changed by the application of $V_{DETERMINE}$. Note that in this case, the application of $V_{DETERMINE}$ switched the resistance value of the upper memory structure 652 from $R_{SET}$ to $R_{RESET}$. Thus, the process continues with block 812, where the resistance of the upper memory structure 652 is switched back to $R_{SET}$ (e.g., by application of −$V_{SET}$) so that the memory state of the resistance memory device 110$d$ is not disturbed by the present read process. Then the process ends at block 814 with a determination that the memory state of the resistance switching device 110$d$ is the memory state A.

Figure 31:
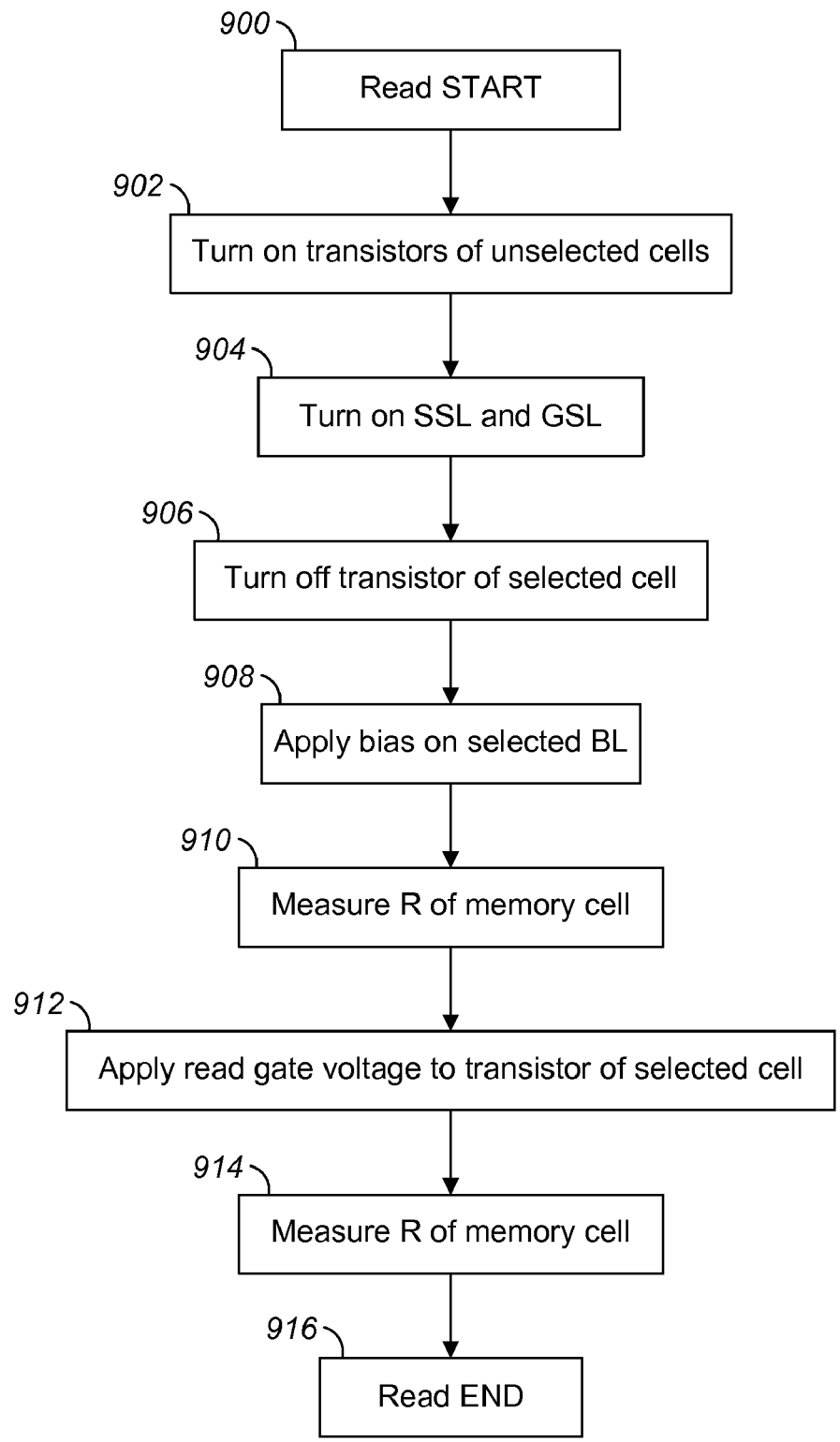
FIG. 31 shows a flowchart of a reading process for the memory cell shown in FIG. 3.

FIG. 31 shows a flowchart of a process for reading a selected one of the memory cells 102 shown in FIGS. 1-3. The process is described by way of example for reading memory cell 102$d$ shown in FIG. 2; however, any memory cell 102 can be similarly read using the process described here and shown in FIG. 31.

In short, the reading process can include turning on transistors 112$a$-112$c$ of the non-selected memory cells 102$a$-102$c$ (block 902), turning on the string select and ground select transistors SST and GST (block 904), reading the resistance switching device 110$d$ (blocks 906-910), and reading the transistor 112$d$ (blocks 912-914). Reading the resistance switching device 110$d$ can include turning off the transistor 112$d$ of the selected memory cell 102$d$ (block 906), applying a voltage to the bit line BLi associated with the memory string MSi of the selected memory cell 102$d$ (block 908), and measuring the resistance of the resistance switching device 110$d$ of the selected memory cell 102$d$ (block 910). Reading the transistor 112$d$ can include applying a mid-range voltage (read gate voltage) to word line WL4 (block 912) and determining whether the applied threshold voltage turned on the transistor 112$d$ (block 914).

At block 900, the read procedure can be initiated for reading a selected memory cell, for example including the use of a read enable signal.

At block 902, the word lines WL of the non-selected memory cells, i.e., word lines WL1-WL3, are activated so as to turn on the transistors 112$a$-112$c$ of the non-selected memory cells 102$a$-102$c$. That is, word lines WL1-WL3 are pulled up above the threshold voltage Vt of the transistors 112$a$-112$c$. In embodiments where the transistors 112$a$-112$c$ are floating-gate transistors (or other transistors capable of being switched between multiple different threshold voltages Vt), the voltage applied to the word lines WL1-WL3 can be set to a high, but non-programming level voltage (a pass voltage). The application of the pass voltage to the transistors 112a-112c allows the transistors 112a-112c to pass current in a manner that is unrestricted by their stored data values.

At block 904, the string select transistor SST and ground select transistor GST are turned on by applying appropriate threshold voltages to the string select line SSL and ground select line GSL.

At block 906, the transistor of the selected memory cell is turned off, i.e., the voltage of word line WL4 is set below the threshold voltage Vt of the transistor 112d of memory cell 102d. In embodiments where the transistor 112d is a floating-gate transistor (or other transistor capable of being switched between multiple different threshold voltages Vt), the voltage applied to the word line WL4 can be lower than the lowest of the multiple different threshold voltages so as to turn off the transistor 112d.

At block 908, an appropriate read voltage is applied between the bit line BLi and the common source line SL, and the remaining bit lines can be floating or zero bias. At block 910, the resistance of the resistance switching device 110d is measured. Blocks 908 and 910 can include read processes described herein, for example as shown in FIGS. 7, 11, 17, 21, 26, and 30, depending on the type of resistance switching device that is used as resistance switching device 110d.

At block 912, a mid-range voltage (read gate voltage) that is intermediate between the possible threshold voltages is applied to word line WL4. For example, in some embodiments, the transistor 112d can be a floating-gate transistor capable of being programmed (e.g., logic state "0") to a first effective threshold voltage $V_{t\text{-}program}$ and erased (e.g., logic state "1") to a second effective threshold voltage $V_{t\text{-}erase}$. Typically the program threshold voltage $V_{t\text{-}program}$ will be higher than the erase threshold voltage $V_{t\text{-}erase}$. The read gate voltage is selected to be between $V_{t\text{-}program}$ and $V_{t\text{-}erase}$ so that the transistor 112d will so turn on if erased (storing logical "1") or will remain off if programmed (storing logical "0").

At block 914 the state of the transistor 112d is detected. Block 914 can include applying an appropriate bias to the bit line BLi and detecting the impedance across the memory string MSi through the memory cell 102d. If the transistor 112d is programmed, the intermediate-level read gate voltage applied to the gate of the transistor 112d at block 912 will not be sufficient to turn on the transistor 112d. Thus, current will flow through the resistance switching device 102d and so some increased amount of resistance (i.e., an amount of resistance that is greater than the pass-through resistance of transistor 112d when turned on) will be detected through the memory cell 102d. On the other hand, if the transistor 112 is erased, the intermediate-level read gate voltage applied to the gate of the transistor 112d at block 912 will be sufficient to turn on the transistor 112d. In this case, the current will pass through the transistor 112d since the transistor 112d will offer almost no resistance compared to that of the resistance switching device 110d.

At block 916 the read process ends with the data of the resistance switching device 110d and transistor 112d having thus been read. Block 916 can include removing voltages to the bit line BLi, word lines WL1-WL4, string select line SSL, and ground select line GSL.

Figure 32:
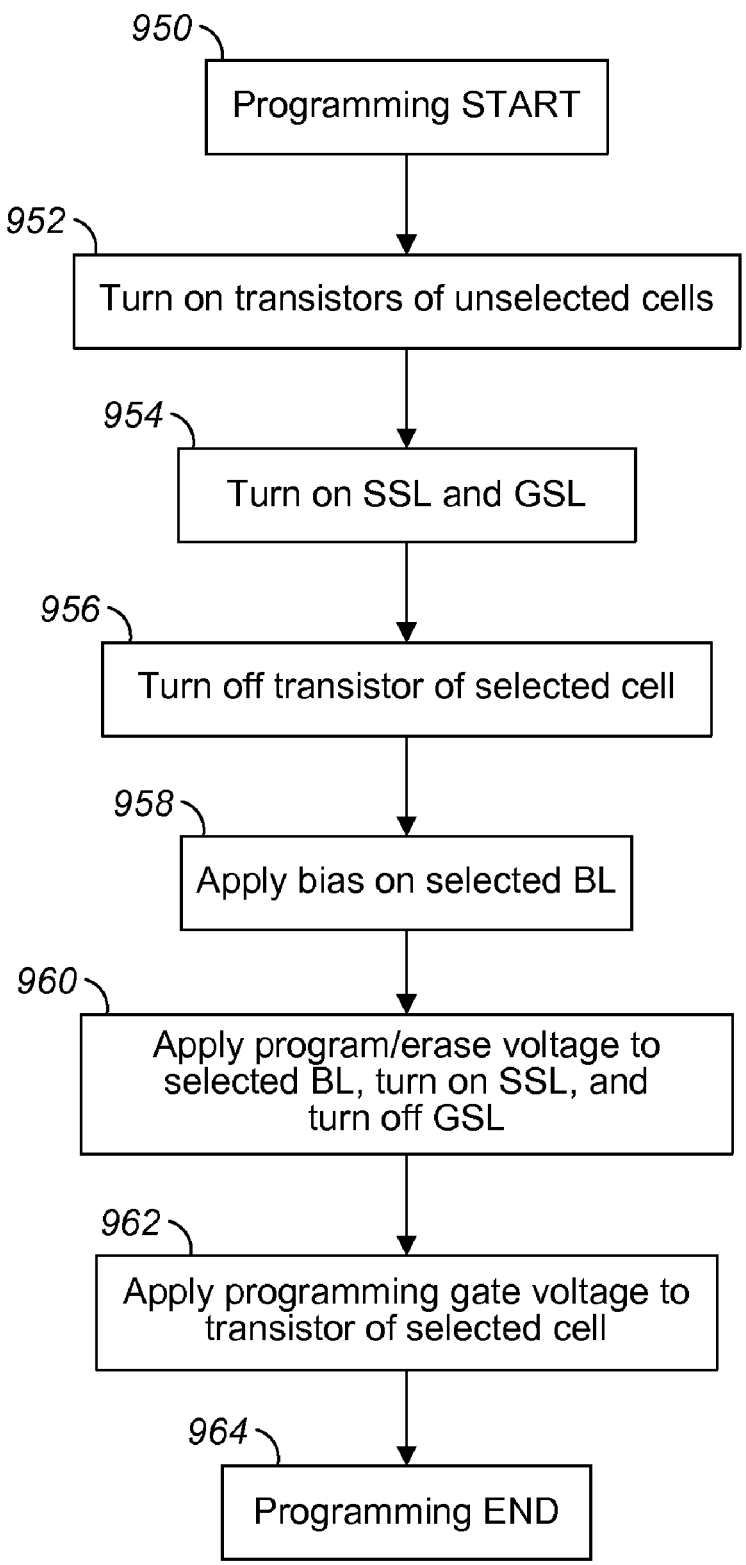
FIG. 32 shows a flowchart of a programming process for the memory cell shown in FIG. 3.

FIG. 32 shows a flowchart of a process for programming a selected one of the memory cells 102 shown in FIGS. 1-3. The process is described by way of example for programming memory cell 102d shown in FIG. 2; however, any memory cell 102 can be similarly programmed using the process described here and shown in FIG. 32.

In short, the programming process can include turning on transistors 112a-112c of the non-selected memory cells 102a-102c (block 952), turning on the string select and ground select transistors SST and GST (block 954), programming the resistance switching device 110d (blocks 956-958), and programming the transistor 112d (blocks 960-962). Programming the resistance switching device 110d can include turning off the transistor 112d of the selected memory cell 102d (block 956) and applying a program voltage to the bit line BLi associated with the memory string MSi of the selected memory cell 102d (block 958). Programming the transistor 112d can include applying a programming gate voltage to word line WL4 (block 960) and applying a program voltage to the bit line BLi (block 962).

At block 950, the programming procedure can be initiated for programming a selected memory cell, for example including the use of a write-enable signal.

At block 952, the word lines WL of the non-selected memory cells, i.e., word lines WL1-WL3, are activated so as to turn on the transistors 112a-112c of the non-selected memory cells 102a-102c. That is, word lines WL1-WL3 are pulled up above the threshold voltage Vt of the transistors 112a-112c. In embodiments where the transistors 112a-112c are floating-gate transistors (or other transistors capable of being switched between multiple different threshold voltages Vt), the voltage applied to the word lines WL1-WL3 can be set to a high, but non-programming level voltage (a pass voltage). The application of the pass voltage to the transistors 112a-112c allows the transistors 112a-112c to pass current in a manner that is unrestricted by their stored data values.

At block 954, the string select transistor SST and ground select transistor GST are turned on by applying appropriate threshold voltages to the string select line SSL and ground select line GSL.

At block 956, the transistor of the selected memory cell is turned off, i.e., the voltage of word line WL4 is set below the threshold voltage Vt of the transistor 112d of memory cell 102d. In embodiments where the transistor 112d is a floating-gate transistor (or other transistor capable of being switched between multiple different threshold voltages Vt), the voltage applied to the word line WL4 can be lower than the lowest of the multiple different threshold voltages so as to turn off the transistor 112d.

At block 958, an appropriate program voltage is applied between the bit line BLi and the common source line SL according to the data to be written to the resistance switching device 110d. The bit line voltage is then removed before programming the transistor 112d.

At block 960, the process of writing data to the transistor 112d begins. The word lines WL of the non-selected memory cells, i.e., word lines WL1-WL3, remain activated. An appropriate program voltage is applied between the bit line BLi and the common source line SL according to the data to be written to the transistor 112d. The bit line program voltage is selected to be a program voltage for writing a logical "0" to the transistor 112d, or a program-inhibit voltage for writing a logical "1" to the transistor 112d. For example, for programming, 0 volts can be applied to the bit line BLi. The string select line SSL is activated, and the ground select line GSL is deactivated.

At block 962, the transistor 112d can be programmed/erased using FN current. A high voltage (programming gate voltage) is applied to word line WL4 while 0 volts is applied to the non-selected word lines WL1-WL3. For example, in some embodiments, the transistor 112d can be a floating-gate transistor capable of being programmed (e.g., logic state "0") to a first effective threshold voltage $V_{t\text{-}program}$ and erased (e.g., logic state "1") to a second effective threshold voltage $V_{t\text{-}erase}$. Typically the program threshold voltage $V_{t\text{-}program}$ will be higher than the erase threshold voltage $V_{t\text{-}erase}$. For example, in some embodiments, a program voltage of 20 volts can be applied to the transistor 112d in order to program the transistor 112d, while 0 volts is applied to the non-selected word lines WL1-WL3.

At block 964 the programming process ends with the data of the resistance switching device 110d and transistor 112d having thus been written. Block 964 can include removing voltages to the bit line BLi, word lines WL1-WL4, string select line SSL, and ground select line GSL.

While various embodiments in accordance with the disclosed principles have been described above, it should be understood that they have been presented by way of example only, and are not limiting. Thus, the breadth and scope of the invention(s) should not be limited by any of the above-described exemplary embodiments, but should be defined only in accordance with the claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 C.F.R. 1.77 or otherwise to provide organizational cues. These headings shall not limit or characterize the invention(s) set out in any claims that may issue from this disclosure. Specifically and by way of example, although the headings refer to a "Technical Field," such claims should not be limited by the language chosen under this heading to describe the so-called technical field. Further, a description of a technology in the "Background" is not to be construed as an admission that technology is prior art to any invention(s) in this disclosure. Neither is the "Summary" to be considered as a characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of such claims shall be considered on their own merits in light of this disclosure, but should not be constrained by the headings set forth herein.

What is claimed is:

1. A memory device comprising an array of memory cells, at least one of the memory cells comprising:
   a transistor having a first terminal, a second terminal, and a gate terminal, the transistor being configured to be switchable between a plurality of different threshold voltages associated with respective memory states; and
   a resistance switching device connected in parallel with the transistor such that the resistance switching device is connected to the first and second terminals of the transistor, the resistance switching device being configured to be switchable between a plurality of different resistances associated with respective memory states, wherein the resistance switching device includes first and second interface regions having respective different resistance switching characteristics, and wherein the resistance switching device includes an oxidizable electrode layer disposed between first and second solid electrolyte layers.

2. The memory device of claim 1, wherein at least one of the first and second interface regions includes at least a portion of a tungsten oxide layer.

3. The memory device of claim 1, wherein the resistance are asymmetrical to the resistance switching characteristics of the second interface region.

4. The memory device of claim 1, wherein the resistance switching characteristics of the first interface region are asymmetrical to the resistance switching characteristics of the second interface region.

5. The memory device of claim 1, wherein the resistance switching device includes a first programmable metallization cell.

6. The memory device of claim 5, wherein the resistance switching device includes a second programmable metallization cell.

7. The memory device of claim 6, wherein the first programmable metallization cell includes the first solid electrolyte layer and the second programmable metallization cell includes the second solid electrolyte layer.

8. The memory device of claim 6, wherein the first programmable metallization cell and the second programmable metallization cell have respective different resistance switching characteristics.

9. The memory device of claim 8, wherein the resistance switching characteristics of the first programmable metallization cell are symmetrical to the resistance switching characteristics of the second programmable metallization cell.

10. The memory device of claim 8, wherein the resistance switching characteristics of the first programmable metallization cell are asymmetrical to the resistance switching characteristics of the second programmable metallization cell.

11. The memory device of claim 1, wherein the resistance switching device includes first and second memory structures.

12. The memory device of claim 11, wherein the first memory structure includes one of an RRAM, an MRAM, and an FRAM.

13. The memory device of claim 1, wherein the transistor includes a floating gate.

14. A memory device comprising:
   a plurality of bit lines;
   a plurality of word lines;
   a first memory string comprising a first group of memory cells;
   a second memory string comprising a second group of memory cells; and
   a common source line connected to the first and second memory strings;
   wherein the first and second memory strings are connected to respective bit lines;
   wherein the word lines are connected to respective memory cells of the first group of memory cells and to respective memory cells of the second group of memory cells;
   wherein the first group of memory cells includes a first memory cell connected between the common source line and a first bit line of the plurality of bit lines, the first memory cell comprising:
   a first transistor having a first terminal, a second terminal, and a gate terminal, the first transistor being configured to be switchable between a plurality of different threshold voltages associated with respective memory states; and
   a first resistance switching device connected in parallel with the first transistor such that the first resistance switching device is connected to the first and second terminals of the first transistor, the first resistance switching device being configured to be switchable between a plurality of different resistances associated with respective memory states, wherein the resistance switching device includes first and second interface regions having respective different resistance switching characteristics, and wherein the resistance switching device includes an oxidizable electrode layer disposed between first and second solid electrolyte layers.

15. The memory device of claim 14, wherein the gate terminal of the first transistor is connected to a first word line of the plurality of word lines.

16. The memory device of claim 14, wherein the first bit line and the common source line can be controlled for storing data to the first transistor and for storing data to the first resistance switching device.

17. The memory device of claim 14, wherein the first bit line and the common source line can be controlled for reading data from the first transistor and for reading data from the first resistance switching device.

18. The memory device of claim 14, wherein at least one of the first and second interface regions includes at least a portion of a tungsten oxide layer.

19. The memory device of claim 14, wherein the first resistance switching device includes a first programmable metallization cell.

20. The memory device of claim 19, wherein the first resistance switching device includes a second programmable metallization cell.

21. The memory device of claim 20, wherein the first programmable metallization cell includes the first solid electrolyte layer and the second programmable metallization cell includes the second solid electrolyte layer.

22. The memory device of claim 14, wherein the first resistance switching device includes first and second memory structures.

23. The memory device of claim 22, wherein the first memory structure includes one of an RRAM, an MRAM, and an FRAM.

24. The memory device of claim 14, wherein the first transistor includes a floating gate.

25. The memory device of claim 14, wherein the second group of memory cells includes a second memory cell connected between the common source line and a second bit line of the plurality of bit lines, wherein the second memory cell comprises a second transistor and a second resistance switching device connected in parallel with the second transistor, wherein the second transistor is configured to be switchable between a plurality of different threshold voltages associated with respective memory states, and wherein the second resistance switching device is configured to be switchable between a plurality of different resistances associated with respective memory states.

26. The memory device of claim 25, wherein the first group of memory cells includes a third memory cell connected between the common source line and the first bit line, wherein the third memory cell comprises a third transistor and a third resistance switching device connected in parallel with the third transistor, wherein the third transistor is configured to be switchable between a plurality of different threshold voltages associated with respective memory states, and wherein the third resistance switching device is configured to be switchable between a plurality of different resistances associated with respective memory states.

27. The memory device of claim 26, wherein the second transistor is connected in series with the third transistor and the third resistance switching device, and wherein the second resistance switching device is connected in series with the third transistor and the third resistance switching device.

28. A method of reading a memory cell of a semiconductor memory device, the method comprising:
detecting a threshold voltage of a transistor of the memory cell, the transistor being configured to be switchable between a plurality of threshold voltages associated with respective memory states; and
detecting a resistance of a resistance switching device of the memory cell, the resistance switching device being connected in parallel with the transistor and being configured to be switchable between a plurality of resistances associated with respective memory states, wherein the resistance switching device includes first and second interface regions having respective different resistance switching characteristics, and wherein the resistance switching device includes an oxidizable electrode layer disposed between first and second solid electrolyte layers.

29. The method of claim 28, wherein the detecting of the threshold voltage of the transistor includes applying a first voltage to a gate terminal of the transistor and applying a second voltage across a source and drain of the transistor memory cell such that current flows through the resistance switching device if the first voltage is not sufficient to turn on the transistor.

30. The method of claim 28, wherein the detecting of the resistance of the resistance switching device includes turning off the transistor.

* * * * *